(12) United States Patent
Tsai et al.

(10) Patent No.: US 11,508,902 B2
(45) Date of Patent: *Nov. 22, 2022

(54) HYBRID ULTRASONIC TRANSDUCER AND METHOD OF FORMING THE SAME

(71) Applicant: TAIWAN SEMICONDUCTOR MANUFACTURING COMPANY LTD., Hsinchu (TW)

(72) Inventors: Yi Heng Tsai, Hsinchu (TW); Fu-Chun Huang, Hsinchu County (TW); Ching-Hui Lin, Taichung (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/194,107

(22) Filed: Mar. 5, 2021

(65) Prior Publication Data
US 2021/0193904 A1 Jun. 24, 2021

Related U.S. Application Data

(63) Continuation of application No. 16/573,833, filed on Sep. 17, 2019, now Pat. No. 10,944,041.

(51) Int. Cl.
*H01L 41/27* (2013.01)
*B81B 7/02* (2006.01)
(Continued)

(52) U.S. Cl.
CPC ............ *H01L 41/27* (2013.01); *B06B 1/0292* (2013.01); *B06B 1/0666* (2013.01); *B81B 7/02* (2013.01);
(Continued)

(58) Field of Classification Search
CPC ....... H01L 41/04; H01L 41/047; H01L 41/08; H01L 41/0805; H01L 41/083; H01L 41/0973; H01L 41/113; H01L 41/1132; H01L 41/1138; H01L 41/25; H01L 41/27; H01L 41/277; H01L 41/29; H01L 41/293; H01L 41/31; H01L 41/311; H01L 41/312; B06B 1/0292; B06B 1/0666; B81B 7/02;
(Continued)

(56) References Cited

U.S. PATENT DOCUMENTS 10,944,041 B1\* 3/2021 Tsai ...................... B06B 1/0666
2012/0319535 A1\* 12/2012 Dausch .................. H01L 41/09
310/365

\* cited by examiner

*Primary Examiner* — Cheung Lee
(74) *Attorney, Agent, or Firm* — WPAT Law; Anthony King

(57) ABSTRACT

A method of manufacturing a semiconductor device includes: forming a first substrate includes a membrane stack over a first dielectric layer, the membrane stack having a first electrode, a second electrode over the first electrode and a piezoelectric layer between the first electrode and the second electrode, a third electrode over the first dielectric layer, and a second dielectric layer over the membrane stack and the third electrode; forming a second substrate, including: a redistribution layer (RDL) over a third substrate, the RDL having a fourth electrode; and a first cavity on a surface of the RDL adjacent to the fourth electrode; forming a second cavity in one of the first substrate and the second substrate; and bonding the first substrate to the second substrate.

20 Claims, 33 Drawing Sheets

(51) Int. Cl.
*B06B 1/02* (2006.01)
*B06B 1/06* (2006.01)
*B81C 3/00* (2006.01)
*H01L 41/113* (2006.01)
*H01L 41/29* (2013.01)

(52) U.S. Cl.
CPC .......... *B81C 3/001* (2013.01); *H01L 41/1138* (2013.01); *H01L 41/29* (2013.01); *B81B 2203/0127* (2013.01); *B81B 2203/04* (2013.01); *B81B 2207/07* (2013.01); *B81C 2201/013* (2013.01); *B81C 2203/033* (2013.01)

(58) Field of Classification Search
CPC ........ B81B 2203/0127; B81B 2203/04; B81B 2207/07; B81C 3/001; B81C 2201/013; B81C 2203/033
See application file for complete search history.

HYBRID ULTRASONIC TRANSDUCER AND METHOD OF FORMING THE SAME

PRIORITY CLAIM AND CROSS-REFERENCE

This application is a continuation application claiming priority to U.S. non-provisional application Ser. No. 16/573,833 filed Sep. 17, 2019, the disclosure of which is hereby incorporated by reference in its entirety.

BACKGROUND

Micro-electro mechanical system (MEMS) devices have recently been developed and are commonly included in electronic equipment. The MEMS devices are micro-sized devices that include a number of elements (e.g., stationary or movable elements) for achieving electro-mechanical functionality. Among the various applications of MEMS technologies, e.g., motion sensors, pressure sensors, inertial sensors, and printer nozzles, micromachined ultrasonic transducers (MUT) have gained widespread attention due to their superior performance compared to conventional ultrasonic sensors.

While extensive research has been conducted in hopes of improving techniques related to the MUT, such techniques still fail to meet many requirements, including the need to increase sensing bandwidth and operating power. Therefore, there is a need to further improve the structures and manufacturing methods of MUTs.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2J are cross-sectional views of intermediate stages of a method of manufacturing a MUT device, in accordance with some embodiments.

FIGS. 4A to 4L are cross-sectional views of intermediate stages of a method of manufacturing a MUT device, in accordance with some embodiments.

DETAILED DESCRIPTION

Figure 1A:
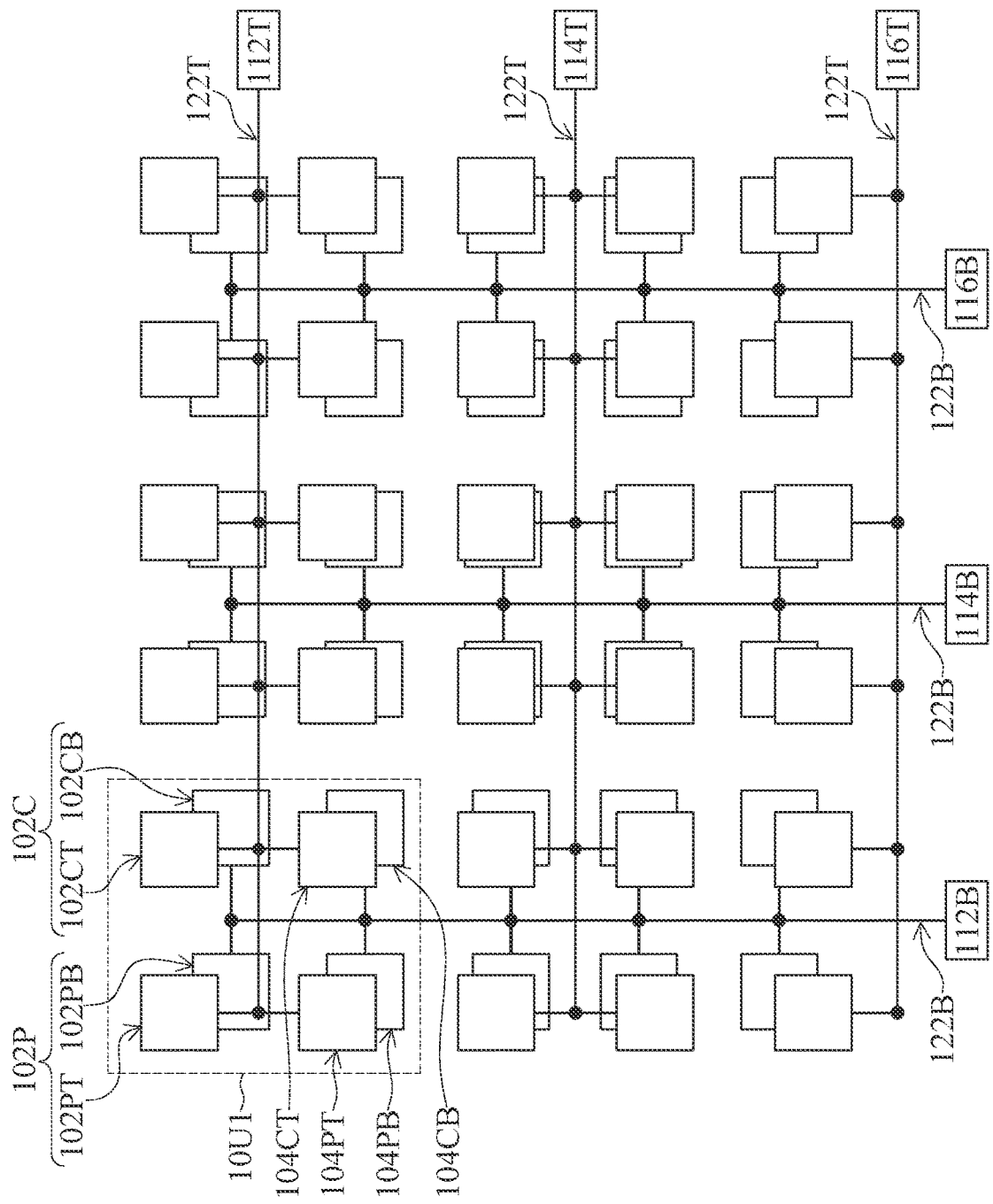
FIG. 1A is a schematic top view of a micromachined ultrasonic transducer (MUT) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 70 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" and "substantially" generally mean within 10%, 5%, 1% or 0.5% of a given value or range. Alternatively, the terms "about," "substantial" and "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The present disclosure discusses structures and fabrication methods of a hybrid micromachined ultrasonic transducer (MUT) device in which piezoelectric MUT (pMUT) devices and capacitive MUT (cMUT) devices are integrated and operated collaboratively. The pMUT device is usually operated at a relatively high intensity and renders low-to-medium resolutions. In contrast, the cMUT device is widely used in high-resolution applications that do not support high ultrasonic intensity. In view of the foregoing, an integrated MUT device manufactured using semiconductor technologies and formed of hybrid cMUTs and pMUTs can provide performance superior to that of the standalone pMUT or cMUT devices. The application of the MUT can be further expanded.

The MUT devices discussed in the present disclosure are applicable to various fields, such as fingerprint sensors, high-intensity focused ultrasound, medical ultrasound imaging, gesture detection and cart-based devices. In some cases, fingerprint sensing is performed with variable sensing depths. The variable sensing depths caused by dirt or stains between the finger and the MUT fingerprint sensor may lead to sensing failure. The proposed hybrid MUT device integrating the cMUT and pMUT devices provides enhanced performance in overcoming the difficulties of sensing across changing sensing depths between the fingerprint and the sensor. In some other cases, high-intensity focused ultrasound (HIFU) and ultrasonic imaging probes are becoming widely accepted in non-invasive medical treatments and real-time medical monitoring. The proposed hybrid MUT device supports integrated HIFU and imaging probing using pMUT and cMUT devices, respectively. The integration, power consumption, performance and cost of the integrated HIFU and real-time medical imaging using the hybrid MUT device can thus be improved.

FIG. 1A is a schematic top view of a MUT device 10, in accordance with some embodiments. The MUT device 10 is a hybrid MUT device including at least two types of MUT devices, such as a pMUT type and a cMUT type. FIG. 1A illustrates selected features of the detailed MUT device 10 for the sake of clarity. These selected features are described in greater detail along with other features with reference to the cross-sectional views of subsequent figures.

The MUT device 10 includes an array of MUT units, such as exemplary pMUT units 102P and 104P and exemplary cMUT units 102C and 104C. Throughout the present disclosure, the term "MUT unit" refers to a basic ultrasonic transducer entity, functioning in a piezoelectrically or capacitively-driven manner and configured to generate and receive ultrasonic signals through a control waveform. One or more MUT units may be appropriately grouped to form a larger transducer entity. For example, FIG. 1A shows an operation unit 10U1 on the upper-left corner of the array. The operation unit 10U1 is composed of two pMUTs and two cMUTs and operates as a single transducer entity. In other embodiments, a transducer unit may be formed purely of pMUT units or purely of cMUT units. As shown in FIG. 1A, the MUT device 10 includes columns of pMUT units and columns of cMUT units where the pMUT columns and cMUT columns are alternately disposed. The depicted topology of the MUT device 10 is shown for illustrative purposes. Other arrangements of pMUT and cMUT units for forming the array of the MUT device 10 are also within the contemplated scope of the present disclosure. In addition, the top electrodes (e.g., top electrodes 102PT, 104PT, 102CT and 104CT) are aligned with the respective bottom electrodes (e.g., bottom electrodes 102PB, 104PB, 102CB and 104CB) in a vertical direction. The top electrodes are illustrated in FIG. 1A as being out of alignment with the respective bottom electrodes merely for the purpose of making the bottom electrodes visible.

Each of the pMUT units, e.g., the pMUT unit 102P or 104P, includes a top electrode 102PT or 104PT and a bottom electrode 102PB or 104PB. A piezoelectric layer (not separately shown) is disposed between the top electrode (102PT or 104PT) and the bottom electrode (102PB or 104PB). The top electrode, bottom electrode and the piezoelectric layer of the pMUT unit 102P or 104P are formed as a membrane stack. The membrane stack of the pMUT unit 102P or 104P is flexible for deflection and configured to generate sensing charges in response to applied mechanical stress (i.e., piezoelectric effect) or generate ultrasonic waves in response to an applied electric field (i.e., reverse piezoelectric effect).

Each of the cMUT units, e.g., the cMUT unit 102C or 104C, includes a top electrode 102CT or 104CT and a bottom electrode 102CB or 104CB. The top electrode (102CT or 104CT) and the bottom electrode (102CB or 104CB) are configured to form a capacitor and are separated by an insulating material, an air gap or a vacuum gap. The top electrode or the bottom electrode of the cMUT unit 102C or 104C is flexible for deflection and configured to generate sensing charges in response to the distance between the top electrode (102CT or 104CT) and the bottom electrode (102CB or 104CB), or generate ultrasonic waves with the movable top electrode or bottom electrode in response to an applied electric field.

The top electrodes (e.g., 102PT, 104PT, 102CT and 104CT) and the bottom electrodes (e.g., 102PB, 104PB, 102CB and 104CB) may be formed of conductive materials, such as polysilicon or metallic materials, e.g., gold, silver, copper, tungsten, aluminum, titanium, tantalum, and the like. The aforesaid top electrodes and bottom electrodes have a quadrilateral shape from a top-view perspective. However, other shapes of the top electrodes and bottom electrodes are also possible, such as a circular shape, a polygonal shape, a bar shape and a ring shape. These top electrodes and bottom electrodes are electrically insulated from their surroundings by insulating materials (not separately shown), such as oxide, nitride, polymer, or other suitable insulator. In the depicted embodiment, the component MUT units (including the cMUT unit and the pMUT unit) of the MUT device 10 include individual top electrodes and bottom electrodes, and the top electrode (e.g., 102PT, 104PT, 102CT and 104CT) of a MUT unit is aligned with the respective bottom electrode (e.g., 102PB, 104PB, 102CB and 104CB). Each of the pMUT units is surrounded by at least two cMUT units, and each of the cMUT units is surrounded by at least two pMUT units. In some other embodiments, the pMUT and cMUT devices are alternately disposed such that each of the pMUT units is surrounded by at least four cMUT units, and each of the cMUT units is surrounded by at least four pMUT units. In some embodiments, the cMUT units and pMUT units are arranged to form a crisscross pattern.

The MUT device 10 further includes a wiring structure electrically coupling the pMUT units and cMUT units to supply or control circuits (not separately shown). These supply and control circuits are electrically coupled to the conductive pads 112T, 114T, 16T, 112B, 114B and 116B. Conductive lines, collectively labeled as 122T, electrically couple the top electrodes (i.e., 102PT, 104PT, 102CT and 104CT) to the conductive pads 112T, 114T and 116T. Similarly, conductive lines, collectively labeled as 122B, electrically couple the bottom electrodes (i.e., 102PB, 104PB, 102CB and 104CB) to the conductive pads 112B, 114B and 116B. During operation, electric waveforms are transmitted to the top electrodes and bottom electrodes of the respective pMUT units or cMUT units through the conductive pads 112T, 114T, 116T, 112B, 114B and 116B and the conductive lines 122T and 122B for performing sensing or generation of ultrasound, depending on the designed control waveforms.

Figure 1B:
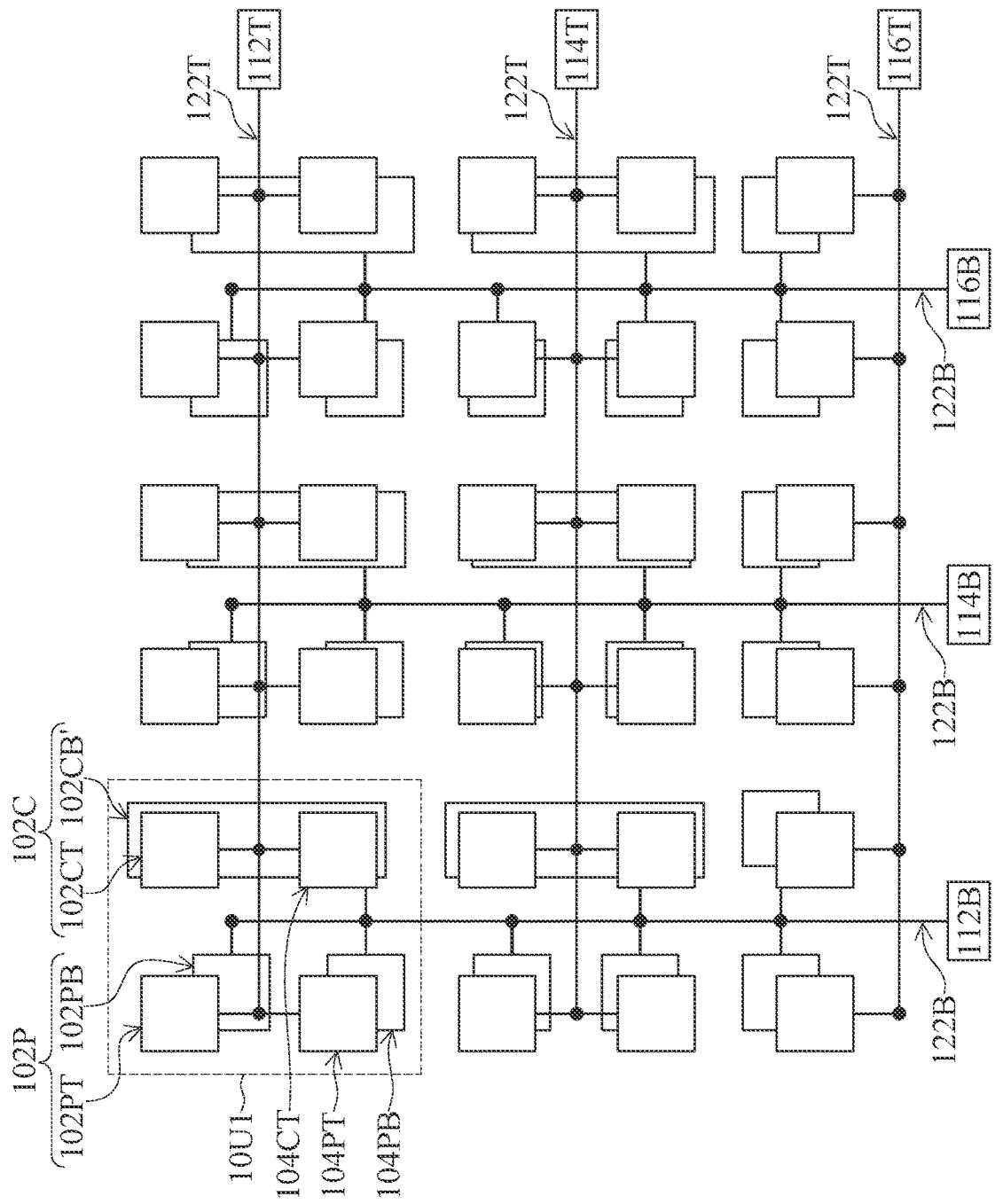
FIG. 1B is a schematic top view of a MUT device, in accordance with some embodiments.

FIG. 1B is a schematic top view of a MUT device 11, in accordance with some embodiments. The MUT device 11 is similar to the MUT device 10 in FIG. 1A except that some of the cMUT units (e.g., cMUT units 102C and 104C) share a bottom electrode 102CB'. In the depicted example, the shared bottom electrode 102CB' has an electrode area greater than the electrode area of the bottom electrode 102CB or 104CB. The shared bottom electrode 102CB' is aligned with the top electrodes 102CT and 104CT. Although not illustrated, the MUT device 11 can also be constructed such that two or more of the pMUT units or the cMUT units are grouped and share a common top electrode, a bottom electrode, or both. The grouped MUT units with shared electrodes naturally form a transducer entity and function as a unit to perform sensing or generation of ultrasound.

Figure 2A:
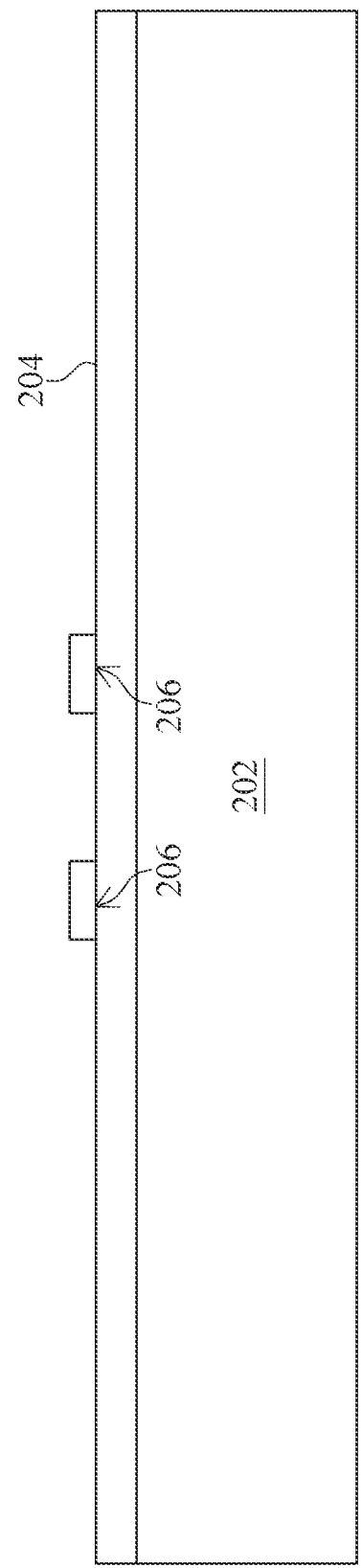
Figure 2B:
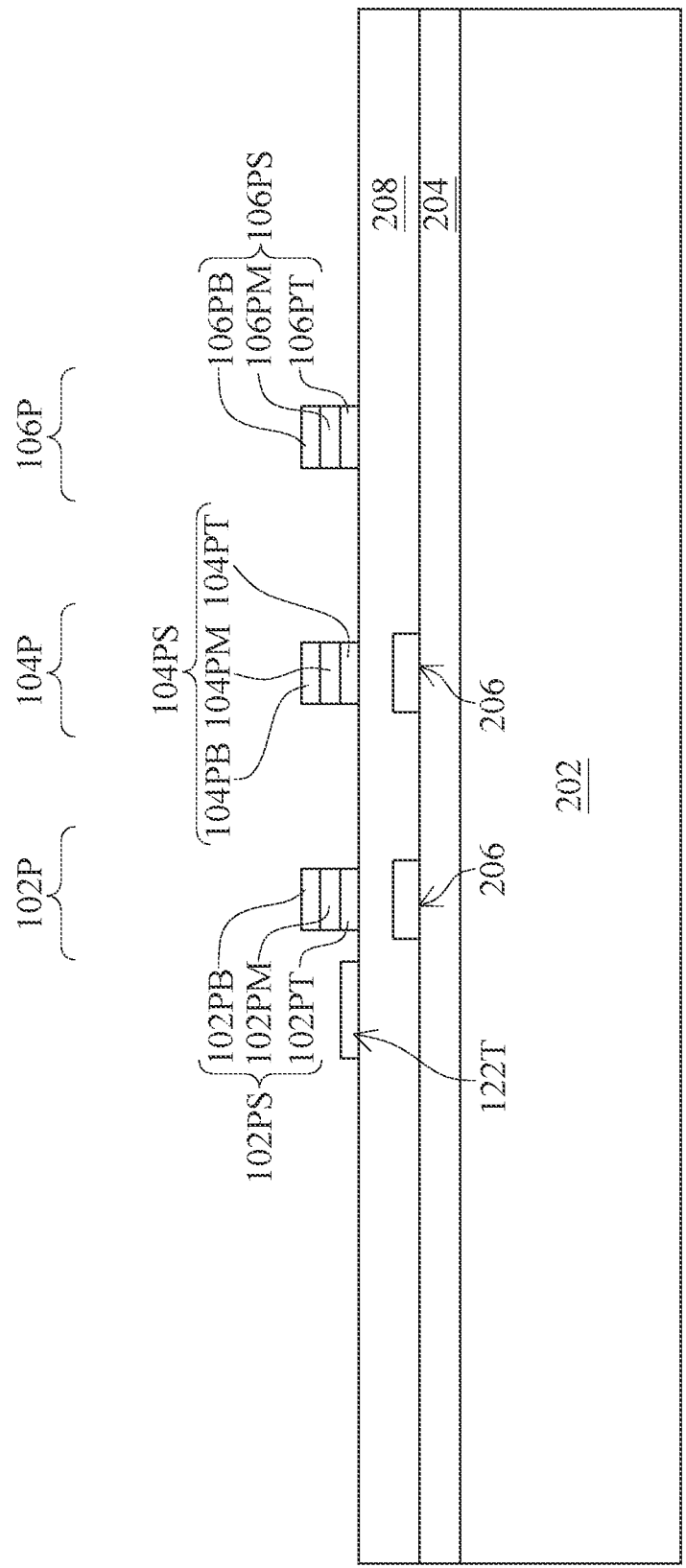
Figure 2C:
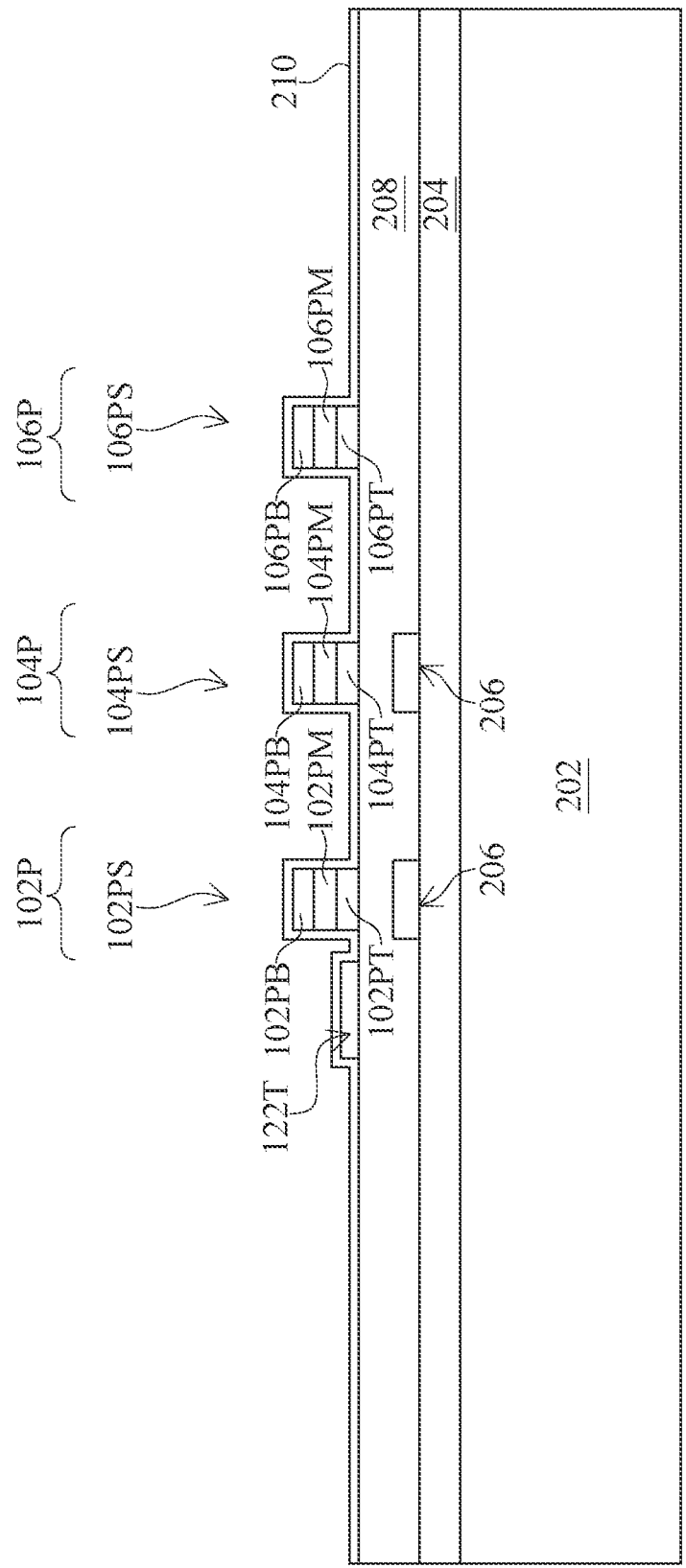
Figure 2D:
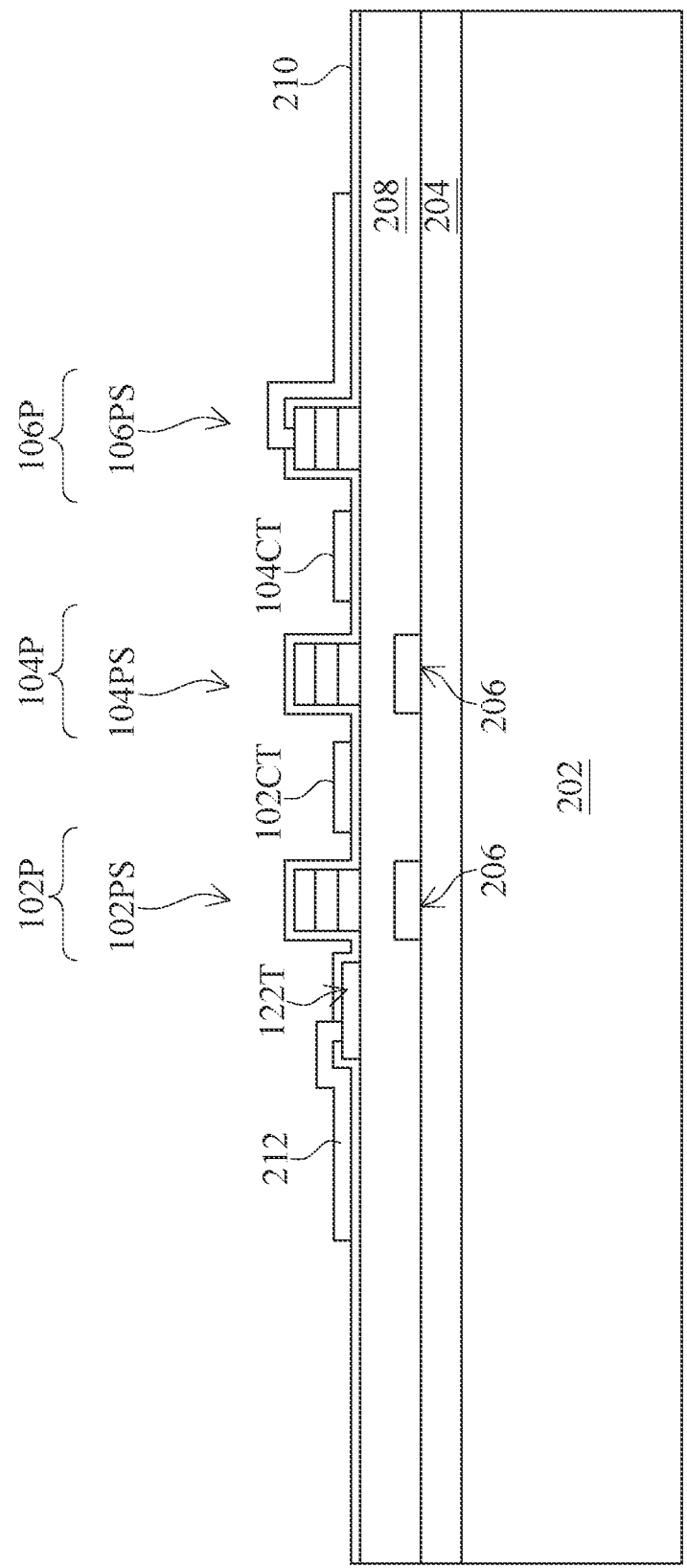
Figure 2E:
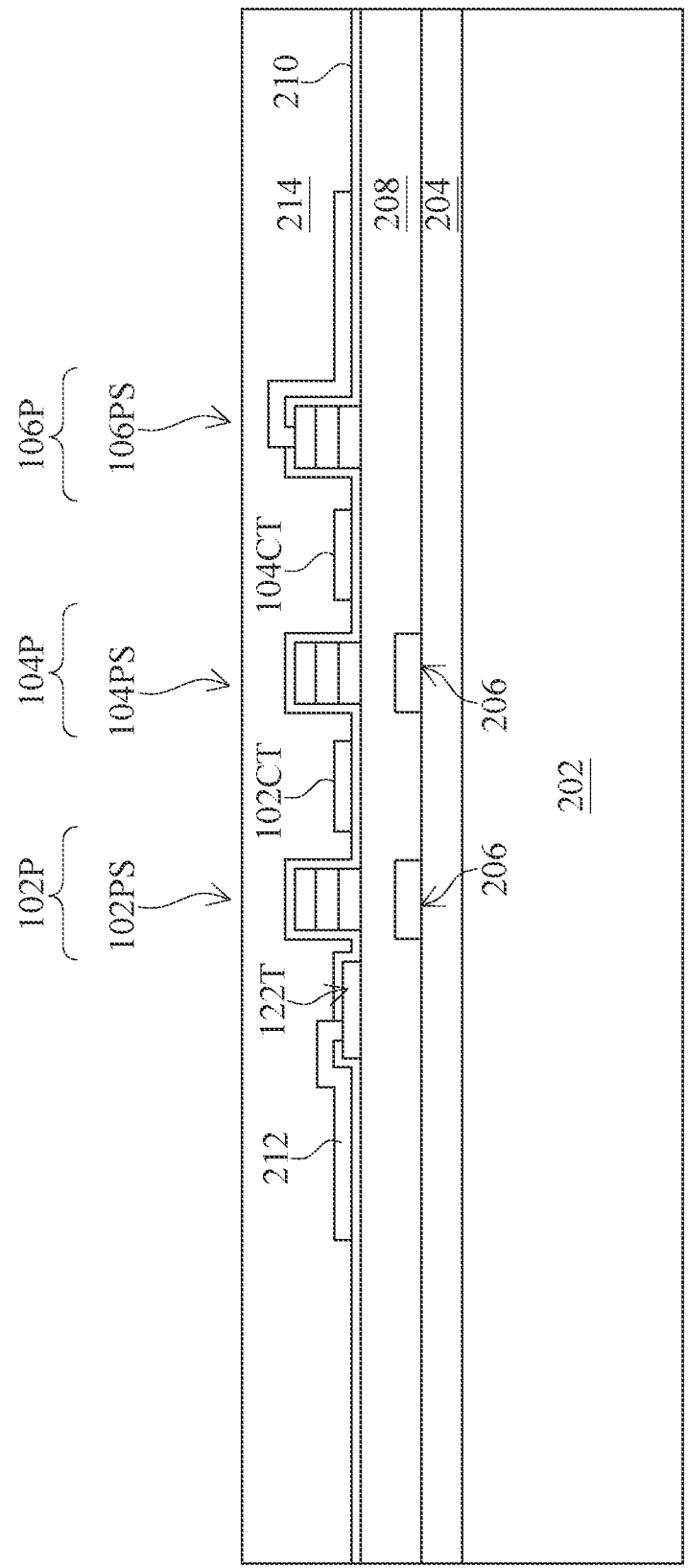
Figure 2F:
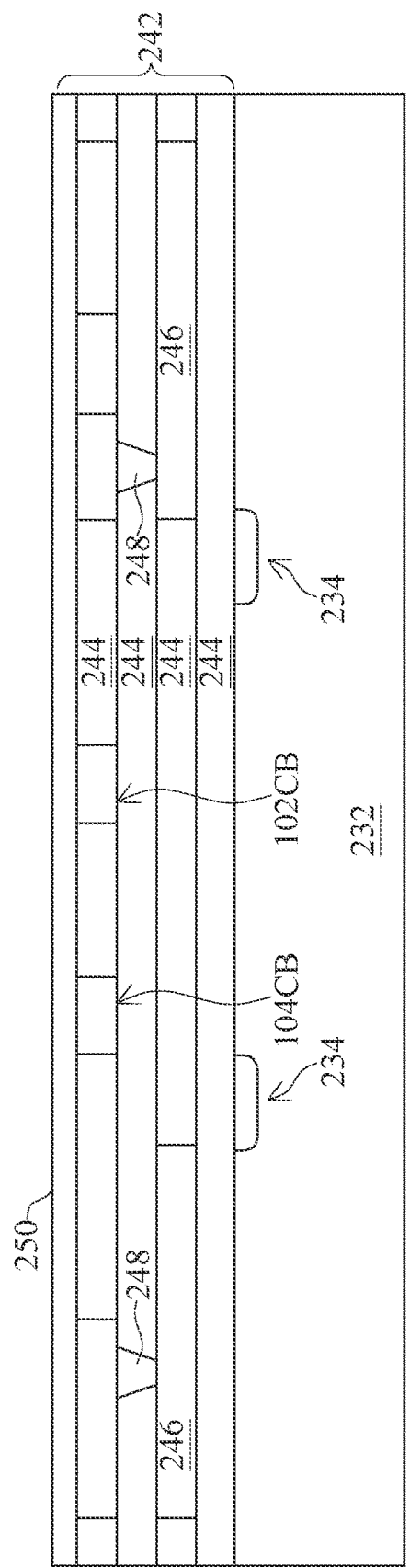
Figure 2G:
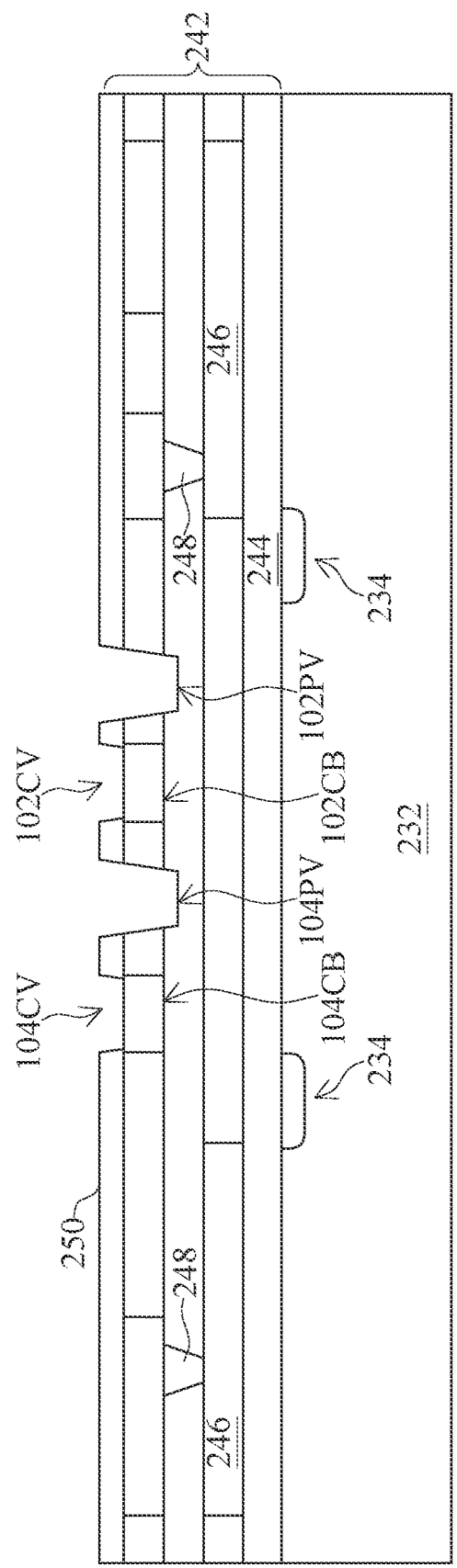
Figure 2H:
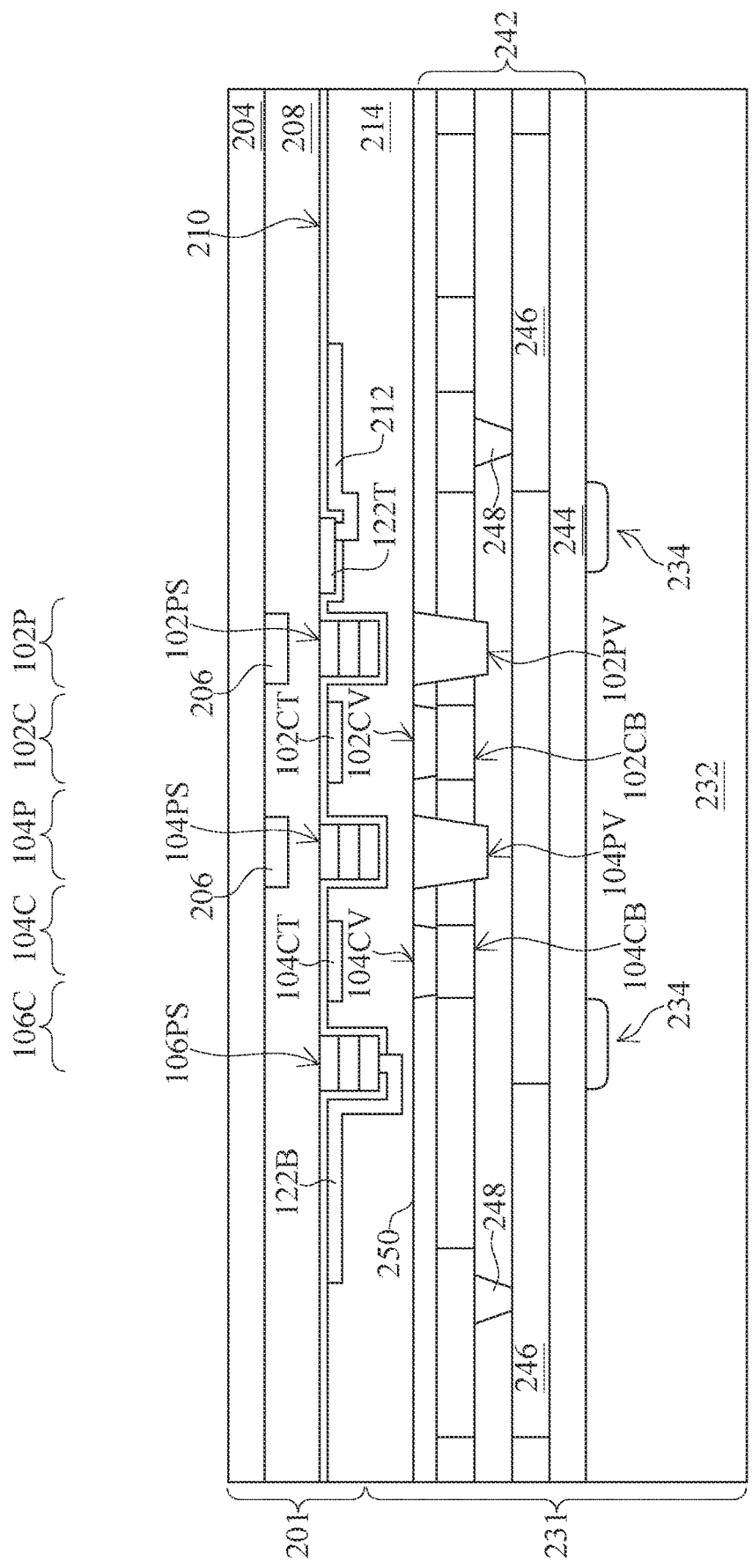
Figure 21:
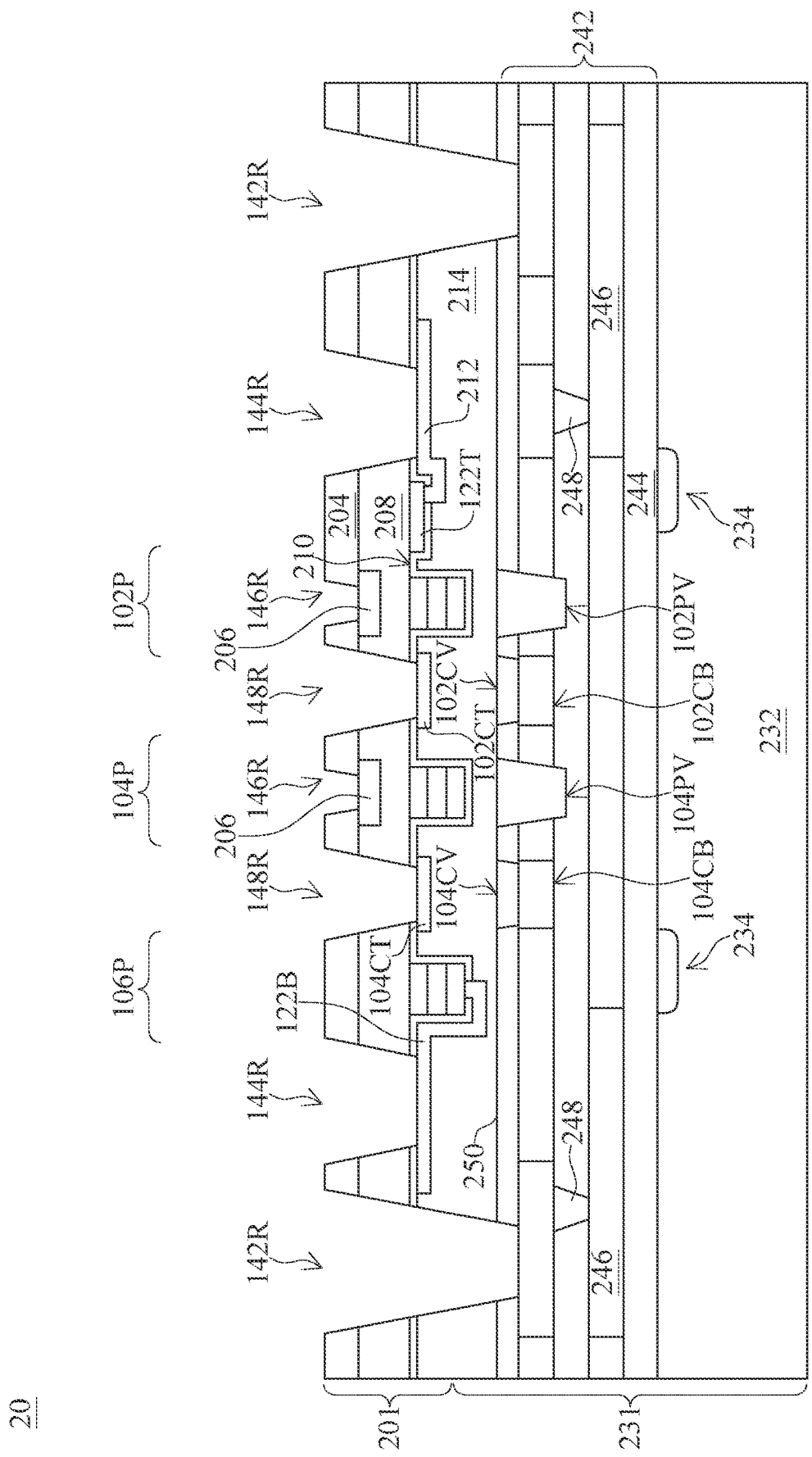
Figure 2J:
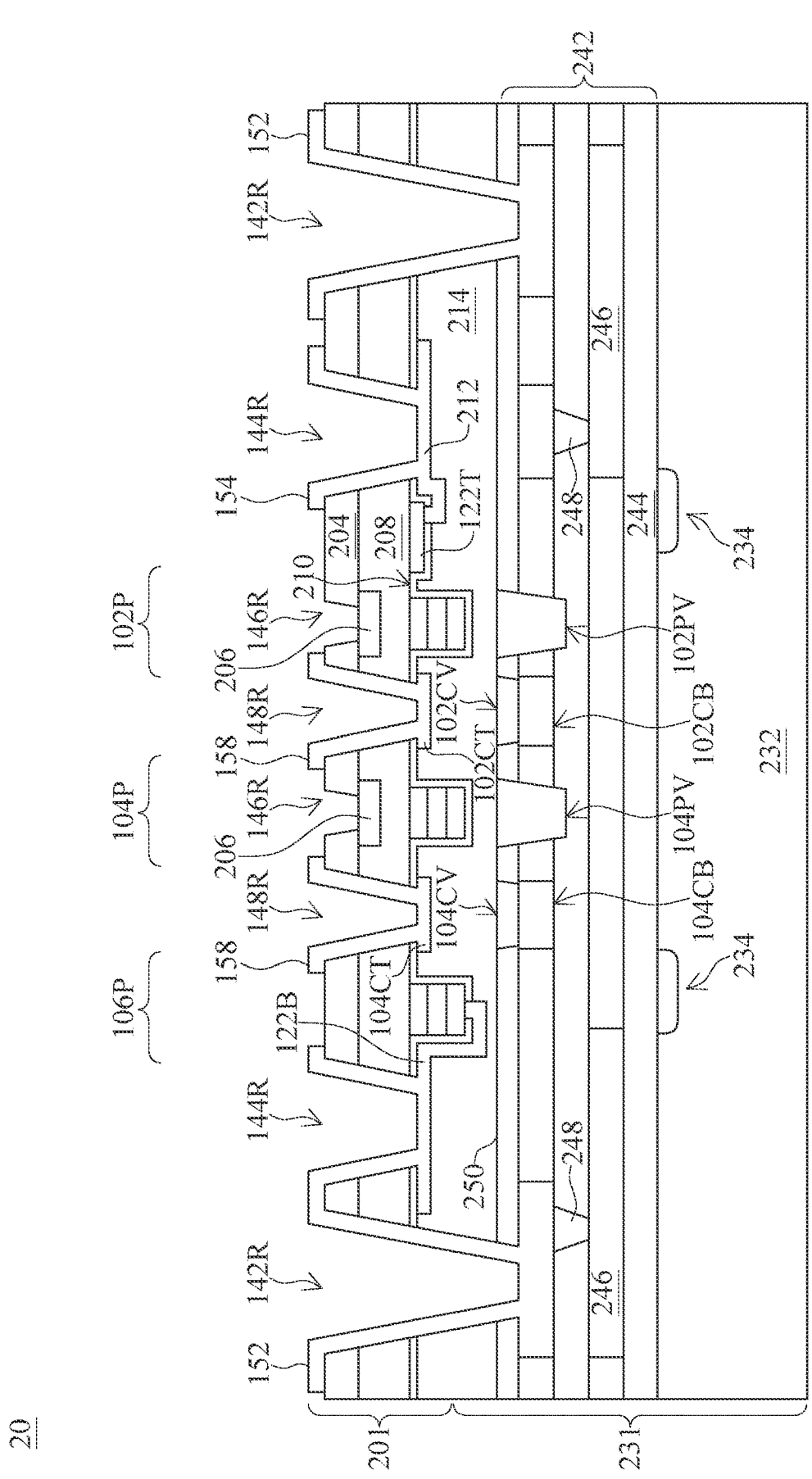

FIGS. 2A to 2J are cross-sectional views of intermediate stages of a method of manufacturing a MUT device 20, in accordance with some embodiments. FIGS. 2A to 2E illustrate the fabrication of a micro-electro mechanical system (MEMS) substrate 201. FIGS. 2F and 2G illustrate the fabrication of a device substrate 231. FIGS. 2H to 2J illustrate the formation of the MUT device 20 through the bonding of the MEMS substrate 201 to the device substrate 231.

Referring to FIG. 2A, a substrate 202 is formed or provided for the fabrication of the MEMS substrate 201. In some embodiments, the substrate 202 is a carrier substrate. The substrate 202 may be a semiconductor substrate, such as a bulk semiconductor, a semiconductor-on-insulator (SOI) substrate, or the like. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate layer that is typically formed of silicon or glass. Other substrates, such as a multi-layered or gradient substrate, may also be used. The substrate 202 may be doped (e.g., with a P-type or an N-type dopant) or undoped. In some embodiments, the semiconductor material of the substrate 202 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A dielectric layer 204 is deposited over the substrate 202. In some embodiments, the dielectric layer 204 includes silicon oxide; however, other materials, such as silicon nitride, silicon carbide and silicon oxynitride, may also be used. The dielectric layer 204 is formed by thermal oxidation, thermal nitridation, physical vapor deposition (PVD) including sputtering and evaporation, chemical vapor deposition (CVD), atomic layer deposition (ALD), a combination thereof, or the like.

Protection regions 206 are deposited over the dielectric layer 204. The protection regions 206 may be formed as part of the pMUT units or cMUT units and act as a protection layer for enhancing the durability of the pMUT units or cMUT units and preventing them from being damaged during deflection. In some embodiments, the protection regions 206 include conductive materials and are referred to as conductive regions 206. In some embodiments, the protection regions 206 include polysilicon. The protection regions 206 are formed by initially depositing a blanket polysilicon layer over the dielectric layer 204 by PVD, CVD, ALD, a combination thereof, or the like, followed by patterning the blanket polysilicon layer to form the protection regions 206. The protection regions 206 may be patterned by photolithography and etching processes. In some embodiments, the protection regions 206 may be doped with impurities, such as N-type dopants or P-type dopants.

In some embodiments, an SOI substrate is provided as the substrate 202 in which the SOI substrate includes an insulator layer and a semiconductor layer over the insulator layer. In some embodiments, the insulator layer of the SOI substrate serves as the dielectric layer 204 and the semiconductor layer of the SOI substrate is patterned to leave the protection regions 206 as desired.

Referring to FIG. 2B, a dielectric layer 208 is formed over the protection regions 206. The dielectric layer 208 includes dielectric materials, such as silicon oxide; however, other dielectric materials, such as silicon nitride, silicon carbide and silicon oxynitride, may also be used. The dielectric layer 208 is formed by deposition techniques such as PVD, CVD, ALD, a combination thereof, or the like. In some embodiments, the dielectric layer 208 and the dielectric layer 204 are formed of the same material. The dielectric layer 208 may cover and laterally surround the protection regions 206. In an embodiment, a planarization operation, such as chemical mechanical planarization (CMP) or mechanical grinding, is employed to planarize the surface of the dielectric layer 208 to provide a level top surface of the dielectric layer 208.

FIG. 2B also illustrates the formation of the membrane stacks 102PS, 104PS and 106PS of the pMUT units 102P, 104P and 106P, respectively, over the dielectric layer 208. A first conductive layer, a piezoelectric layer and a second conductive layer are deposited over one another. In some embodiments, the first conductive layer and the second conductive layer may include conductive materials having a high temperature coefficient of resistance. The first conductive layer and the second conductive layer may include gold, silver, copper, tin, platinum, zinc, molybdenum, calcium, lead, iron, nickel, lithium, titanium, tungsten, aluminum, titanium nitride, combinations thereof, or the like. The first conductive layer or the second conductive layer may be deposited to a thickness in a range between about 50 nm and about 2000 nm. The first conductive layer and the second conductive layer may be deposited by a suitable deposition process, such as PVD, CVD, ALD, electroplating, screen-printing, and the like.

The piezoelectric layer may include quartz single crystals, piezoelectric ceramics such as lithium niobate, gallium arsenide, zinc oxide, aluminum nitride and lead zirconate-titanate (PZT), polymer-film piezoelectrics, such as polyvinylidene fluoride (PVDF), or the like. The piezoelectric layer may be deposited to a thickness in a range between about 50 nm and about 2000 nm. The piezoelectric layer may be deposited by PVD, CVD, ALD, electroplating, screen-printing, sol-gel process, and the like.

One or more patterning operations are performed to pattern the first conductive layer, the piezoelectric layer and the second conductive layer. As a result, the membrane stack 102PS of the pMUT unit 102P is formed including a top electrode 102PT, a piezoelectric layer 102PM and a bottom electrode 102PB. The MEMS substrate 102 is to be flipped in the bonded MUT device 20 (shown in FIG. 2H), and thus the top electrode 102PT and the bottom electrode 102PB are given their names in terms of their relationships in the bonded MUT device 20. Likewise, the membrane stack 104PS of the second pMUT unit 104P is formed including a top electrode 104PT, a piezoelectric layer 104PM and a bottom electrode 104PB, and the membrane stack 106PS of the third pMUT unit 106P is formed including a top electrode 106PT, a piezoelectric layer 106PM and a bottom electrode 106PB. In some embodiments, a pitch between the membrane stacks 102PS, 104PS, and 106PS is between about 1 μm and about 500 μm, depending upon design requirements. In some embodiments, the membrane stacks 102PS and 104PS are aligned with the respective protection regions 206. In some embodiments, no protection region corresponding to the membrane stack 106PS is present.

In some embodiments, a conductive line 122T is formed during the patterning of the top electrodes 102PT, 104PT and 106PT. The conductive line 122T is electrically coupled to the top electrodes 102PT through other circuits not separately shown in FIG. 2B. In addition, although not illustrated, one or more conductive lines collectively referred to as the conductive lines 122T and 122B of FIGS.

1A, 1B and 2B are formed to electrically couple to the top electrodes 102PT, 104PT or 106PT or the bottom electrodes 102PB, 104PB or 106PB.

In one embodiment, a single patterning operation is employed to simultaneously pattern the top electrodes, the piezoelectric layers and the bottom electrodes of the pMUT units 102P, 104P and 106P. The single patterning operation allows the patterned top electrodes, piezoelectric layers and bottom electrodes to have substantially identical shapes from a top-view perspective and have substantially equal widths from a cross-sectional view.

In some embodiments, multiple patterning operations are performed to pattern the top electrodes, piezoelectric layers and bottom electrodes with individual shapes and widths. In some other embodiments, the bottom electrode 102PB, 104PB or 106PB has a width less than a width of the respective piezoelectric layer 102PM, 104PM or 106PM, and the width of the piezoelectric layer 102PM, 104PM or 106PM has a width less than a width of the respective top electrode 102PT, 104PT or 106PT. In some embodiments, the width difference between the bottom electrode 102PB, 104PB or 106PB and the piezoelectric layer 102PM, 104PM or 106PM of the pMUT unit 102P, 104P or 106P, respectively, is between about 1 μm and about 5 μm or between about 1% and about 5% of the width of the bottom electrode 102PB, 104PB or 106PB. In some embodiments, the width difference between the piezoelectric layer 102PM, 104PM or 106PM and the top electrode 102PT, 104PT or 106PT of the pMUT unit 102P, 104P or 106P, respectively, is between about 1 μm and about 5 μm or between about 1% and about 5% of the width of the piezoelectric layer 102PB, 104PB or 106PB. In some embodiments, at least one of the pMUT units 102P, 104P and 106P has a sidewall with a stepped shape. The differences between the widths of top electrodes, piezoelectric layers and the bottom electrodes may aid in enhancing the physical and electrical properties of the patterned top electrodes, piezoelectric layers and the bottom electrodes.

The formation of the membrane stacks 102PS, 104PS, and 106PS may be performed at a temperature up to about 200° C. In some embodiments, a thermal operation is performed on the deposited membrane stacks 102PS, 104PS, and 106PS for improving the properties of the membrane stacks of the pMUT units 102P, 104P and 106P. An annealing operation, such as a furnace anneal or a rapid thermal anneal (RTA), is performed at a temperature between about 700° C. and about 800° C.

Referring to FIG. 2C, a dielectric layer 210 is deposited over the dielectric layer 208, the membrane stacks 102PS, 104PS and 106PS, and the conductive line 122T. The dielectric layer 210 may be conformally formed over the top surfaces and sidewalls of the dielectric layer 208, the pMUT units 102P, 104P and 106P, and the conductive line 122T. The dielectric layer 210 may include a thickness between about 1 nm and about 1000 nm. The dielectric layer 210 may include silicon oxide, silicon nitride, or a high-k dielectric material. The high-k dielectric material may include hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, lanthanum oxide, zirconium oxide, yttrium oxide, titanium oxide, tantalum oxide, aluminum oxide, hafnium dioxide-alumina (HfO$_2$-Al$_2$O$_3$) alloy, other suitable high-k dielectric materials, or combinations thereof. The dielectric layer 210 may be formed using PVD, CVD, ALD or other suitable deposition methods.

FIG. 2D shows the formation of top electrodes 102CT and 104CT and conductive lines 122B and 212 over the dielectric layer 210. Initially, the dielectric layer 210 is patterned to form openings on the upper surface of the bottom electrode 102PB, 104PB or 106PB (an exemplary opening is illustrated above the bottom electrode 106PB) and the upper surface of the conductive line 122T. A conductive layer is deposited in a blanket manner over the dielectric layer 210 and the openings in the dielectric layer 210. The conductive layer may be formed of gold, silver, copper, tin, platinum, zinc, molybdenum, calcium, lead, iron, nickel, lithium, titanium, tungsten, aluminum, titanium nitride, combinations thereof, or the like using PVD, CVD, ALD, electroplating, screen-printing, or other suitable deposition process. A patterning operation is performed to remove excess portions of the conductive layer to leave the top electrodes 102CT and 104CT. The top electrodes 102CT and 104CT are disposed between the membrane stacks 102PS, 104PS and 106PS.

A conductive line 122B, which is electrically coupled to the upper surface of the bottom electrode 106PB, and a conductive line 212, which is electrically coupled to the upper surface of the conductive line 122T, is also formed during the patterning operation that forms the top electrodes 102CT and 104CT. In some embodiments, the conductive line 122B extends along the surface of the dielectric layer 210 and the vertical portion of the dielectric layer 210 on the sidewall of the membrane stack 106PS, and reaches the upper surface of the bottom electrode 106PB. In some embodiments, the patterning of the top electrodes 102CT and 104CT and the patterning of the conductive lines 122B and 212 are performed using separate patterning operations.

Referring to FIG. 2E, a dielectric layer 214 is formed to cover and laterally surround the dielectric layer 210, the top electrodes 102CT and 104CT, and the conductive lines 122T, 122B and 212. The dielectric layer 214 includes dielectric materials, such as silicon oxide; however, other dielectric materials, such as silicon nitride, silicon carbide, silicon oxynitride or a high-k dielectric material, may also be used. The dielectric layer 214 may include a thickness between about 1 nm and about 1000 nm. The dielectric layer 214 is formed by deposition techniques such as PVD, CVD, ALD, a combination thereof, or the like. In some embodiments, the dielectric layer 214, the dielectric layer 208 and the dielectric layer 204 are formed of the same material. In an embodiment, a planarization operation, such as CMP or mechanical grinding, is employed to planarize the surface of the dielectric layer 214 to provide a level top surface of the dielectric layer 214. As a result, the fabrication of the MEMS substrate 201 is completed.

Referring to FIG. 2F, a substrate 232 is formed or provide for the fabrication of the device substrate 231. The substrate 232 may be a semiconductor substrate, such as a bulk semiconductor, a semiconductor-on-insulator (SOI) substrate, or the like. The substrate 232 may be doped (e.g., with a P-type or an N-type dopant) or undoped. In some embodiments, the semiconductor material of the substrate 232 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 232 may include a plurality of semiconductor devices 234 formed on the surface of the substrate 232. The semiconductor devices 234 may be active devices, such as field effect transistors (FET), that include metal-oxide-semiconductor (MOS) FET and junction FET devices, or passive devices, such as diodes, resistors, capacitors, inductors and the like. The substrate 232 may also include conductive lines (not separately shown) electrically coupled to the semiconductor devices 234.

A redistribution layer (RDL) 242 is formed over the substrate 232. In some embodiments, the RDL 242 is configured to electrically interconnect the semiconductor devices 234 or to couple the semiconductor devices 234 to an upper circuit over the RDL 242. The RDL 242 generally includes stacked metallization layers comprised of conductive features connected with each other to establish the interconnection routes. For example, FIG. 2F illustrates four metallization layers stacked over one another. Each of the metallization layers may include conductive lines 246 or vias 248 in which the conductive lines 246 are electrically coupled to an adjacent overlaying or underlying conductive line 246 through intervening conductive vias 248. The conductive lines 246 and the conductive vias 248 may be formed of conductive materials, such as gold, silver, copper, tin, platinum, zinc, molybdenum, calcium, lead, iron, nickel, lithium, titanium, tungsten, aluminum, titanium nitride, combinations thereof, or the like using PVD, CVD, ALD, electroplating, screen-printing or other suitable deposition process.

Each of the metallization layers also includes insulating materials, wherein the portion of the metallization layer including the insulating materials is usually referred to as an inter-metal dielectric (IMD) layer 244, for insulating the conductive lines and conductive vias 248. In some embodiments, the IMD layer 244 is formed of silicon oxide, silicon nitride, silicon oxynitride, silicon carbide, un-doped silicate glass (USG), fluorinated silicate glass (FSG), borophosphosilicate glass (BPSG), tetraethosiloxane (TEOS), spin-on glass (SOG), high-density plasma (HDP) oxide, plasma-enhanced TEOS (PETEOS), or the like, by PVD, CVD, ALD, spin-coating, or other suitable deposition process.

In some embodiments, during the formation of the metallization layers of the RDL 242, bottom electrodes 102CB and 104CB of the respective cMUT units 102C and 104C are also formed simultaneously. In some embodiments, the materials and forming methods of the bottom electrodes 102CB and 104CB are similar to those of the conductive lines 246 and conductive vias 248.

In some embodiments, after the formation of the metallization layers mentioned above, a passivation layer 250 is formed as the topmost layer of the RDL 242. In some embodiments, the passivation layer 250 serves as a protection layer that covers the underlying bottom electrodes 102CB and 104CB and does not include any conductive lines or vias. In some embodiments, the passivation layer 250 includes dielectric materials similar to those of the IMD layer 244 and is formed using methods similar to those of the IMD layer 244.

Subsequently, several cavities are formed on the surface of the RDL 242 and through the passivation layer 250, as shown in FIG. 2G. For example, cavities 102CV and 104CV for the cMUT units 102C and 104C are formed to expose the bottom electrodes 102CB and 104CB, and cavities 102PV and 104PV for the pMUT units 102P and 104P are formed adjacent to the cavities 102CV and 104CV. In some embodiments, the cavities 102PV and 104PV have a depth greater than a depth of the cavities 102CV and 104CV. In some embodiments, the cavity 102PV or 104PV has a bottom surface lower than a bottom surface of the cavity 102CV or 104CV. In some embodiments, the cavity 102PV or 104PV has a bottom surface lower than a bottom surface of the bottom electrode 102CB or 104CB. The forming of the cavities 102CV and 104CV and the forming of the cavities 102PV and 104PV may be performed separately.

The cavities 102CV and 104CV may be formed by an etching operation, such as a dry etching, a wet etching, a combination thereof, such as reactive ion etching (RIE), or the like. The etching of the cavities 102CV and 104CV may be performed with the bottom electrodes 102CB and 104CB acting as etch stop layers. In some embodiments, the cavities 102CV and 104CV have sidewalls tapering from the upper surface of the RDL 242 to the bottom electrodes 102CB and 104CB.

In some embodiments, the cavities 102PV and 104PV may be formed by an etching operation, such as a dry etching, a wet etching, a combination thereof, such as reactive ion etching (RIE), or the like. The etching of the cavities 102PV and 104PV may be performed using a time-based etch. In some embodiments, the cavities 102PV and 104PV have sidewalls tapering from the upper surface of the RDL 242 to the bottom surfaces of the cavities 102PV and 104PV.

FIG. 2H illustrates the bonding of the MEMS substrate 201 to the device substrate 231 for forming the MUT device 20. The MEMS substrate 201 is flipped and aligned with the device substrate 231 in an initial stage of the bonding operation. The bonding operation may be performed using a thermal compression bonding, fusion bonding, anodic bonding, eutectic bonding, solder bonding or the like. Through the bonding operation, the MEMS substrate 201 is bonded to the device substrate 203 through the dielectric layer 204 and the passivation layer 250. Further, the substrate 202 is thinned or removed from the MUT device 20. In some embodiments, the substrate 232 is also thinned. The substrate 202 or the substrate 232 may be thinned or removed by a wet etching, dry etching, mechanical grinding or other removal process. The dielectric layer 204 is thus exposed through the removal of the substrate 202.

In the bonded structure of the MUT device 20, the cMUT units 102C and 104C are alternately disposed with the pMUT units 102P and 104P. The membrane stacks 102PS and 104PS of the pMUT units 102P and 104P are aligned with the cavities 102PV and 104PV, respectively, and the top electrodes 102CT and 104CT of the cMUT units 102C and 104C are aligned with the cavities 102CV and 104CV, respectively. The cavities 102PV, 104PV, 102CV and 104CV are formed to provide spaces for the deflection of the movable membrane stacks 102PS and 104PS of the pMUT units 102P and 104P or the movable top electrodes 102CT and 104CT during sensing and generation of ultrasound. In some embodiments, the bonding operation is performed in a vacuum or highly vacuum environment at a barometric pressure between about 1E-5 and about 1E-4 mtorr such that the cavities 102PV, 104PV, 102CV and 104CV are substantially vacuum cavities. In some embodiments, the cavities 102PV, 104PV, 102CV and 104CV have a barometric pressure between about 1E-5 and about 1E-4 mtorr.

In some embodiments, the protection regions 206 are arranged as electrically isolated regions. In some embodiments, the pMUT unit 106 serves as a dummy pMUT unit that does not perform generation or sensing of ultrasound and is used as a conductive feature to electrically couple to the conductive lines 122B.

Referring to FIG. 2, recesses 142R are formed on the upper surface of the bonded MUT device 20. For example, two recesses 142R are formed through the MEMS substrate 201 and the passivation layer 250 to expose upper surfaces of the corresponding conductive lines 246 of the RDL 242. Further, two recesses 144R are formed through the dielectric layers 204, 208 and 210 to expose upper surfaces of the corresponding conductive lines 122B and 212. The recesses 142R and 144R may be formed using an etching operation, such as a dry etching, a wet etching, an RIE, a plasma etching, or the like, with the conductive lines 246, 122B and 212 acting as etch stop layers.

In addition, two recesses 146R are formed through the dielectric layer 204 to expose upper surfaces of the corresponding protection regions 206. The membrane stack 102PS and 104PS of the respective pMUT units 102P and 104P thus obtain reduced thicknesses as desired. Likewise, two recesses 148R are formed through the dielectric layers 204, 208 and 210 to expose upper surfaces of the corresponding top electrodes 102CT and 104CT. The membrane structures of the top electrodes 102CT and 104CT of the respective cMUT units 102C and 104C thus obtain reduced thicknesses as desired.

FIG. 2J illustrates the formation of conductive lines 152, 154 and 158 over the MEMS substrate 201 and in the recesses 142R, 144R and 148R. A conductive material is conformally deposited over the upper surface of the bonded MUT device 20 and in the recesses 142R, 144R and 148R by PVD, CVD, ALD, electroplating, screen-printing or any suitable deposition process. The conductive material may include gold, silver, copper, tin, platinum, zinc, molybdenum, calcium, lead, iron, nickel, lithium, titanium, tungsten, aluminum, titanium nitride, combinations thereof, or the like. A patterning operation is performed to pattern the conductive lines as desired. For example, the conductive lines 152 formed in the recesses 142R electrically couple the device substrate 232 to the MEMS substrate 201. The left-hand side conductive line 152 is further coupled to the pMUT unit 106P through the conductive line 122B. The conductive line 154 formed in the right-hand side recesses 144R is electrically coupled to the conductive line 212. In addition, the conductive lines 158 formed in the recesses 148R are electrically coupled to the top electrode 102CT and 104CT.

The operations starting from the bonding of the MEMS substrate 201 and the device substrate 231 and subsequent operations illustrated in FIGS. 2H to 2J may be performed at a first temperature lower than a second temperature at which the MEMS substrate 201 is fabricated. (The second temperature may be, e.g., between about 700° C. and about 800° C.). In some embodiments, the operations illustrated in FIGS. 2H to 2J are performed at the first temperature up to about 200° C. Separate fabrication flows of the MEMS substrate 201 and the device substrate 231 before they are bonded can aid in protecting the structures of the device substrate 231 from being damaged.

The MUT device 20 includes the cMUT units 102C and 104T alternately disposed with the pMUT units 102P and 104P. Therefore, the cMUT units and the pMUT units can function together to perform sensing and generation of ultrasound with an increased resolution and improved power. The transducer performance rendered by the MUT device 20 is thus enhanced.

Figure 3A:
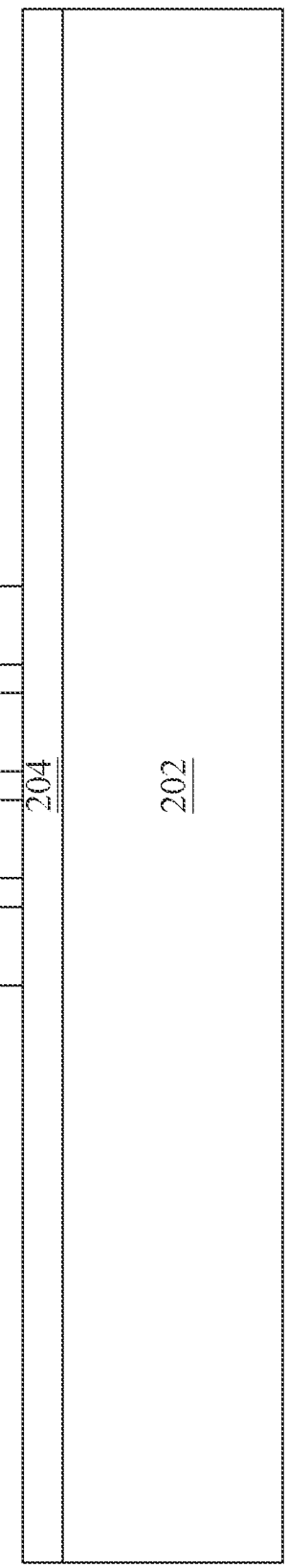
FIGS. 3A to 3I are cross-sectional views of intermediate stages of a method of manufacturing a MUT device, in accordance with some embodiments.

FIGS. 3A to 3 are cross-sectional views of intermediate stages of a method of manufacturing a MUT device 30, in accordance with some embodiments. The method of manufacturing the MUT device 30 is similar to that of manufacturing the MUT device 20 as illustrated in FIGS. 2A to 2J. Throughout the present disclosure, like numerals labeled in different figures or in different embodiments signify like features with common materials, configuration and method of forming, and details of the features that have been described in preceding paragraphs are not repeated for simplicity.

Referring to FIG. 3A, the MEMS substrate 301 is provided or formed in a manner similar to that of the MEMS substrate 201. The dielectric layer 204 is deposited over the substrate 202. The protection regions 206 are formed over the dielectric layer 204.

Figure 3B:
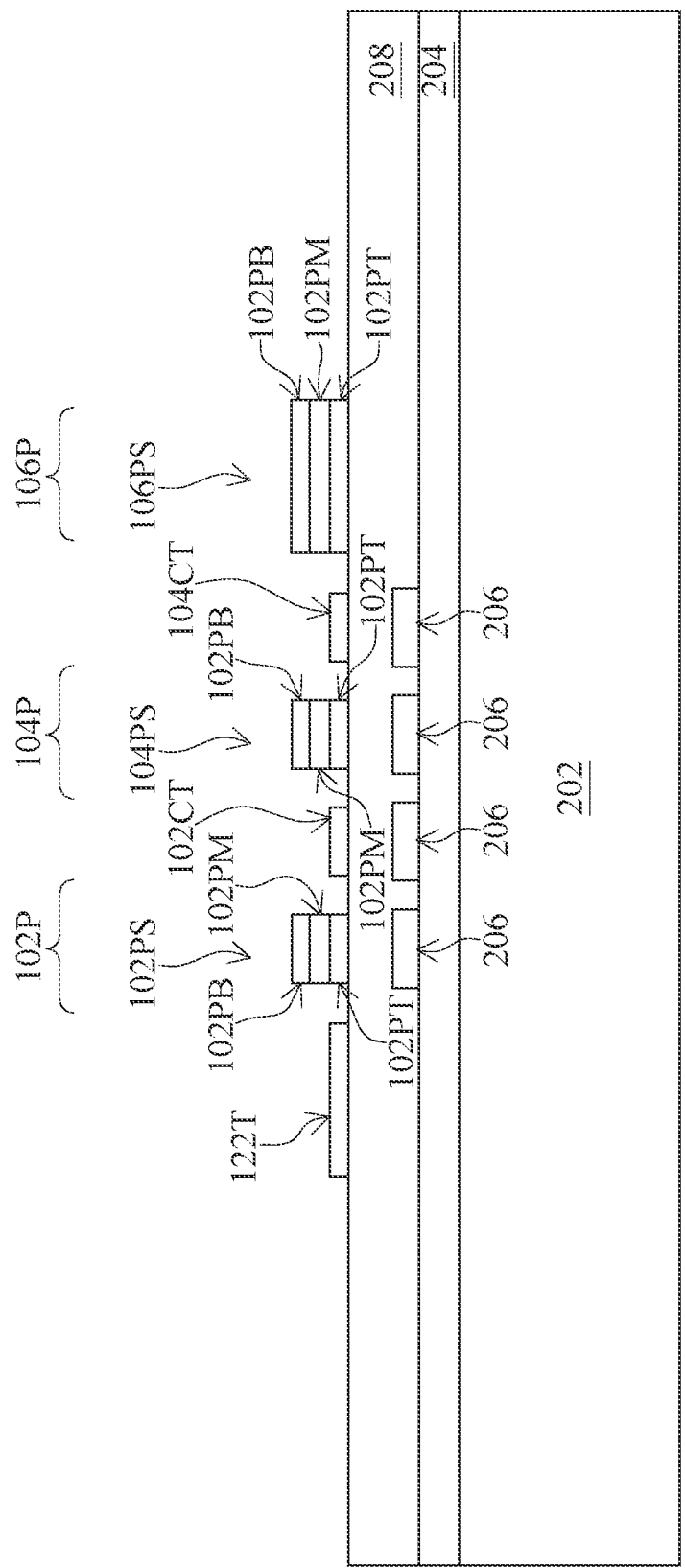

Referring to FIG. 3B, the dielectric layer 208 is formed to cover and laterally surround the protection regions 206 and the dielectric layer 204. Subsequently, the membrane stacks 102PS, 104PS, and 106PS of the respective pMUT units 102P, 104P and 106P are formed over the dielectric layer 208. Simultaneously, the top electrodes 102CT and 104CT of the respective cMUT units 102C and 104C are also formed. In some embodiments, each of the pMUT units 102P and 104P or each of the cMUT units 102C and 104C is aligned with a respective protection region 206. In some embodiments, the pMUT unit 106P serves as a dummy device and the membrane stack 106PS serves as a conductive terminal only. In some embodiments, the conductive line 122T is formed over the dielectric layer 208 during the formation of the top electrodes 102PT, 104PT, 106PT, 102CT and 104CT. In some embodiments, although not illustrated, the interconnect structures that electrically couple to the membrane stacks 102PS, 104PS, and 106PS and the top electrodes 102CT and 104CT are formed and patterned with the conductive line 122T and the bottom electrode 106PB acting as input/output (I/O) terminals of the MEMS substrate 301.

Figure 3C:
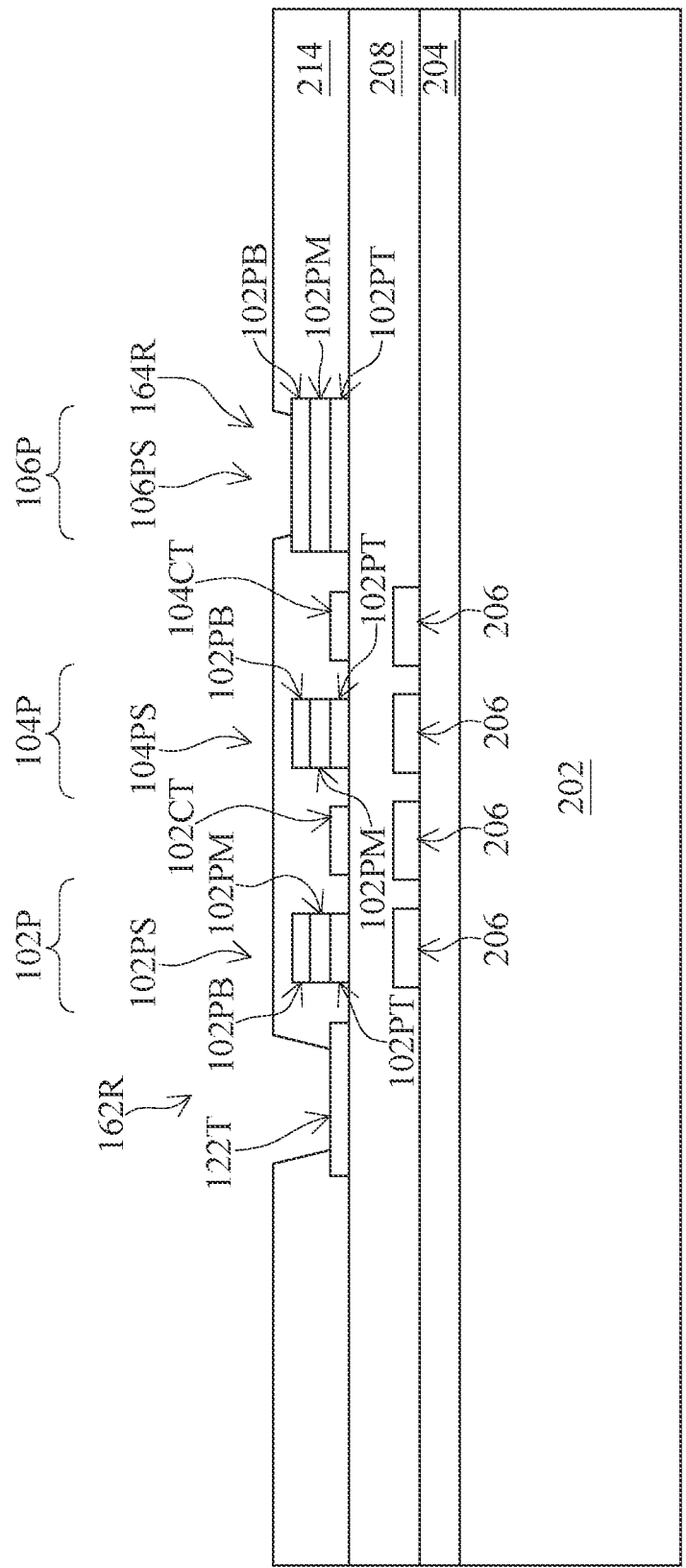

FIG. 3C illustrates the dielectric layer 214 formed to cover and laterally surround the membrane stacks 102PS, 104PS, and 106PS, the top electrodes 102CT and 104CT and the conductive line 122T. Recesses 162R and 164R are etched to expose the conductive line 122T and the bottom electrode 106PB of the membrane stack 106PS, respectively. The method of forming the recesses 162R and 164R are similar to that of forming the recess 142R in FIG. 2I.

Figure 3D:
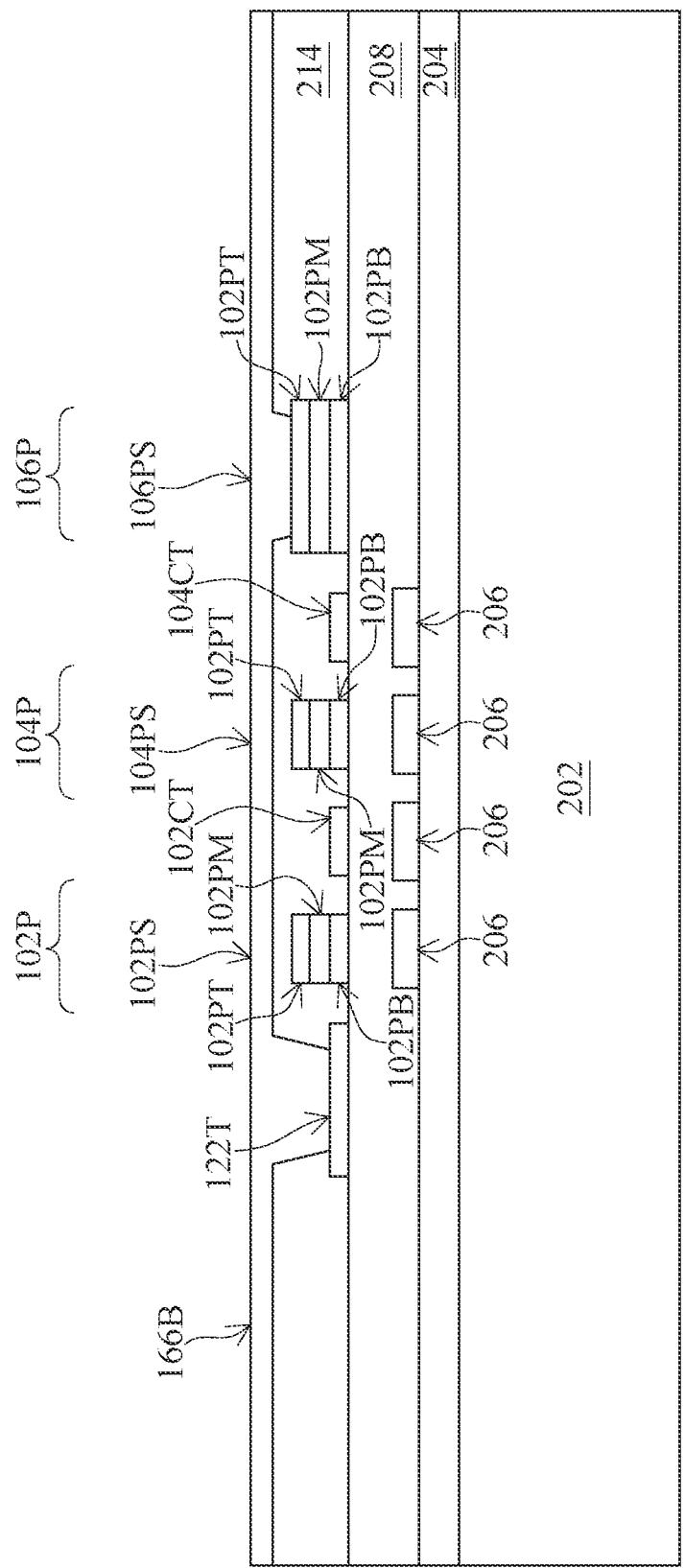

FIG. 3D shows the deposition of a conductive layer 166B over the dielectric layer 214 and filling the recesses 162R and 164R. The conductive layer 166B may include conductive materials such as gold, silver, copper, tin, platinum, zinc, molybdenum, calcium, lead, iron, nickel, lithium, titanium, tungsten, aluminum, titanium nitride, and the like. The conductive layer 166B may be deposited using PVD, CVD, ALD, electroplating, screen-printing or other suitable deposition process.

Figure 3E:
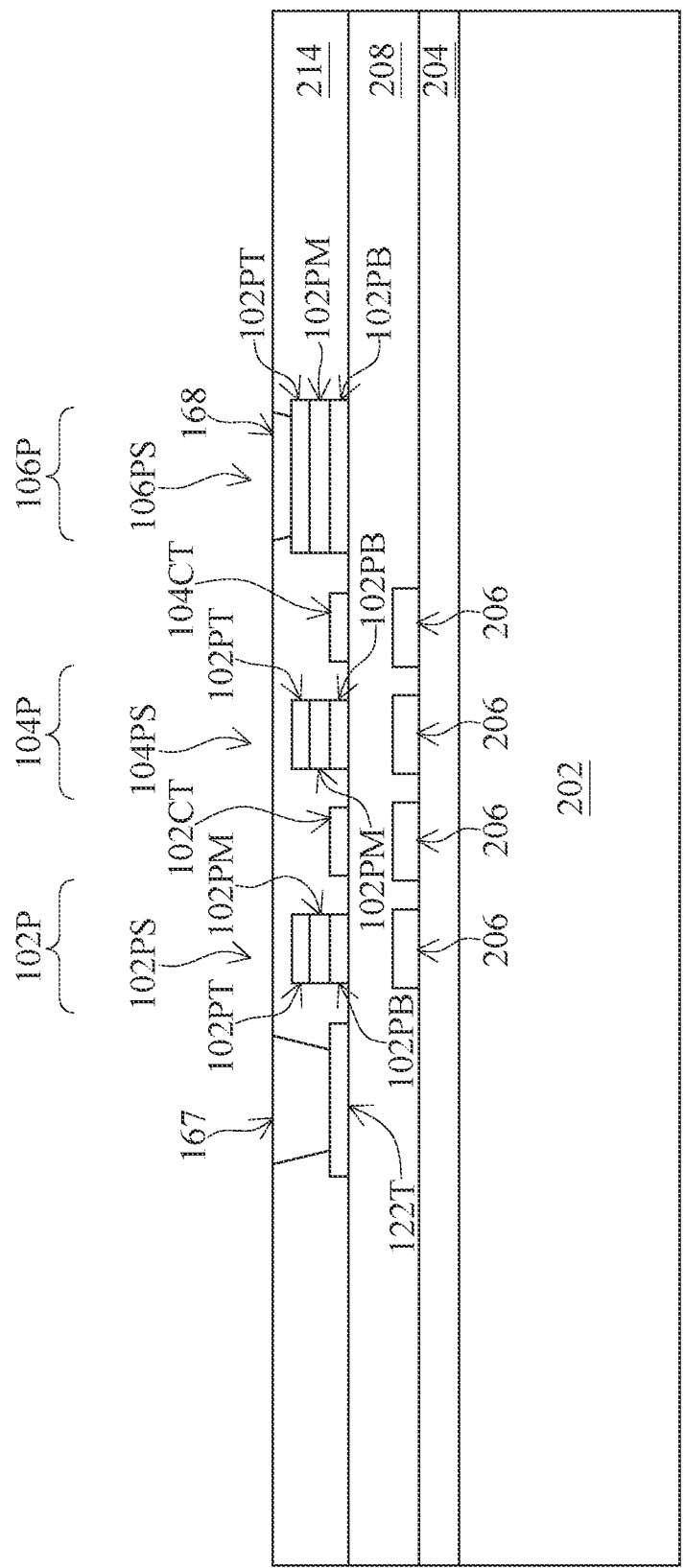

FIG. 3E illustrates a planarization process that removes the excess materials of the conductive layer 166B over the upper surface of the dielectric layer 214. The planarization process may be performed by CMP, mechanical grinding, plasma etching or other etching operations. As a result, conductive vias 167 and 168 are formed over the conductive line 122T and the membrane stack 106PS, respectively, and serve as I/O pads of the MEMS substrate 301.

Figure 3F:
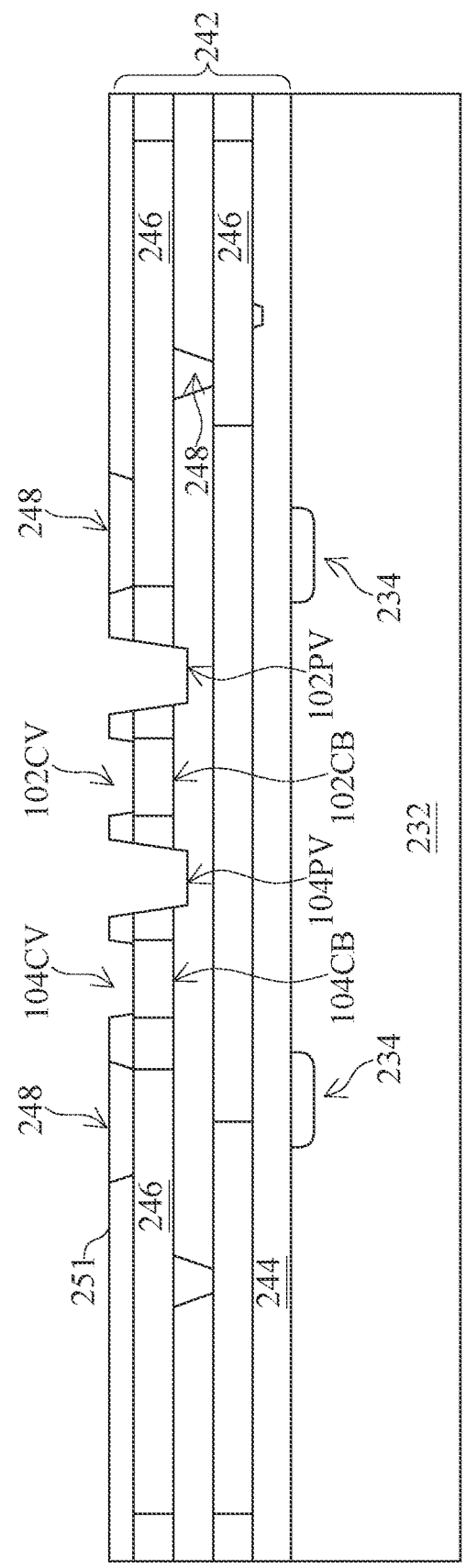

FIG. 3F illustrates the fabrication of the device substrate 331. The device substrate 331 is similar to the device substrate 231, except that the routing circuits of the RDL 242 formed by the conductive lines 246 and conductive vias 248 in the device 331 may be different from those in the RDL 242 in the device 231, depending on the design requirement. During the formation of the RDL 242, a topmost metallization layer 251, which corresponds to the passivation layer 250 of the device substrate 231, of the device substrate 331 is formed over the bottom electrodes 102CB and 104CB, wherein the IMD layer 244 covers and laterally surrounds the bottom electrodes 102CB and 104CB. The topmost metallization layer 251 further includes at least two conductive vias 248 exposed through the upper surface of the RDL 242. The cavities 102CV and 104CV are formed over the bottom electrodes 102CB and 104CB and expose the upper surfaces of the 102CB and 104CB, respectively, in a manner similar to that of the operations illustrated in FIG. 2G.

Figure 3G:
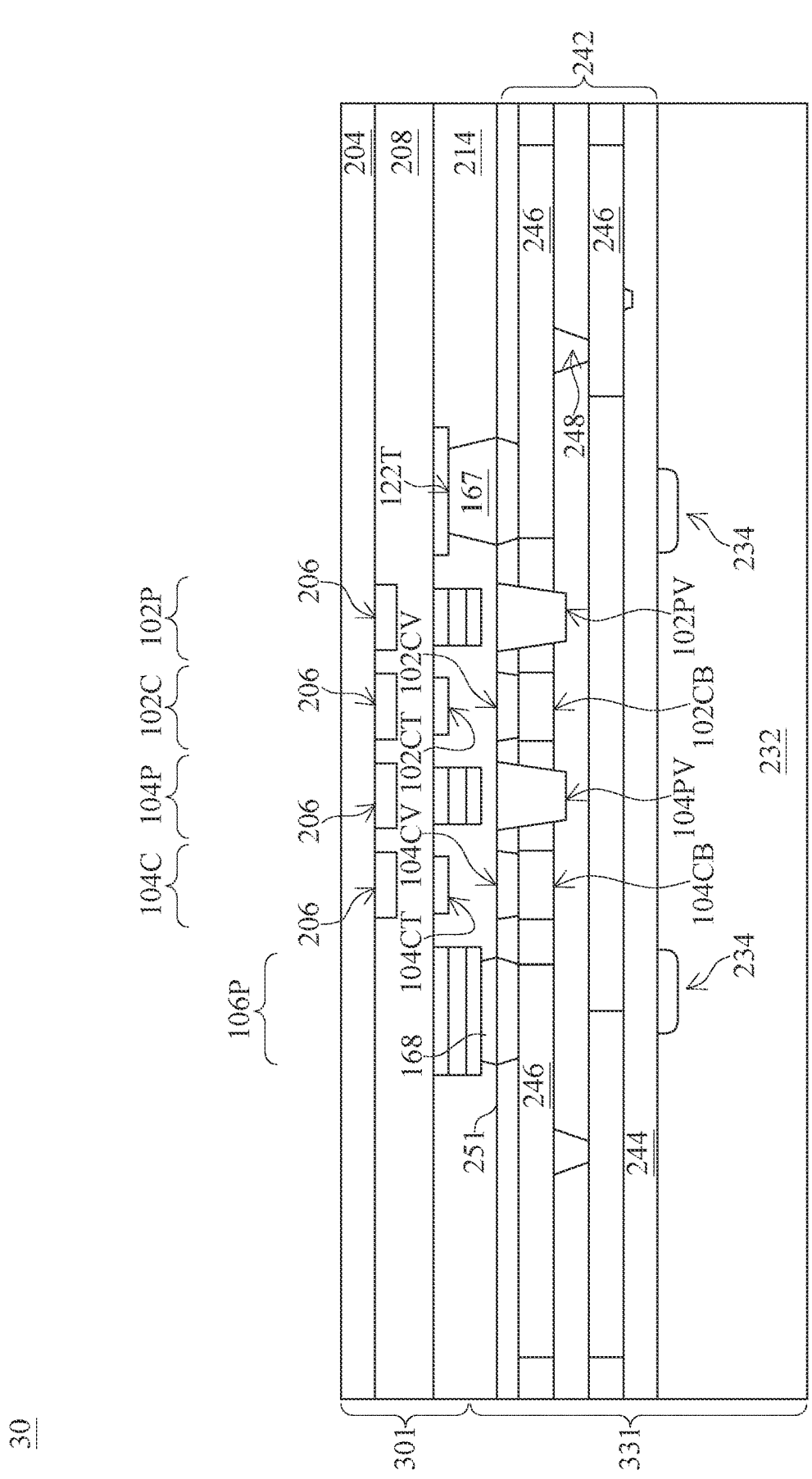

Referring to FIG. 3G, the MEMS substrate 301 is flipped and bonded to the device substrate 331 to form the MUT device 30. The substrate 202 of the MEMS substrate 301 is subsequently thinned or removed after the bonding operation. In some embodiments, the substrate 232 is thinned. Through the bonding operation, the dielectric layer 214 of the MEMS substrate 301 is bonded to the IMD layer 244 of the metallization layer 251 of the device substrate 331, and the conductive vias 167 and 168 are bonded and electrically coupled to the corresponding conductive vias 248 of the metallization layer 251.

Figure 3H:
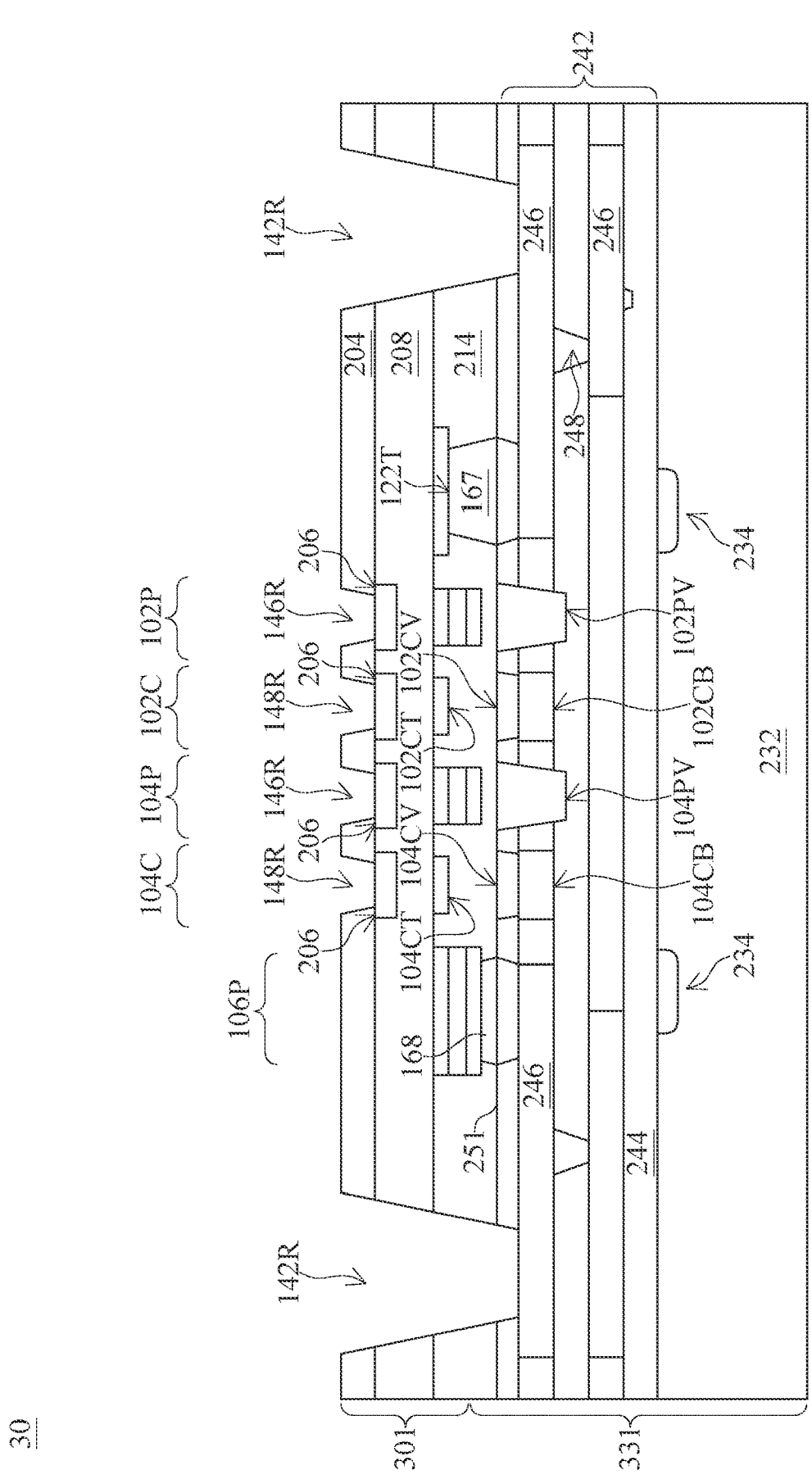

Recesses 142R, 146R and 148R are formed on the upper surface of the MUT device 30, as shown in FIG. 3H. For example, two recesses 142R are formed through the MEMS substrate 301 and the metallization layer 251 to expose upper surfaces of the corresponding conductive lines 246 of the RDL 242. The recesses 142R may be formed using an etching operation, such as a dry etching, a wet etching, an RIE, a plasma etching, or the like, with the conductive lines 246 acting as etch stop layers.

In addition, recesses 146R and 148R are formed through the dielectric layer 204 to expose upper surfaces of the corresponding protection regions 206. The membrane stacks 102PS and 104PS of the respective pMUT units 102P and 104P and the membrane structures of top electrodes 102CT and 104CT of the respective cMUT units 102C and 104C thus obtain reduced thicknesses as desired through the respective recesses 146R and 148R.

Figure 3I:
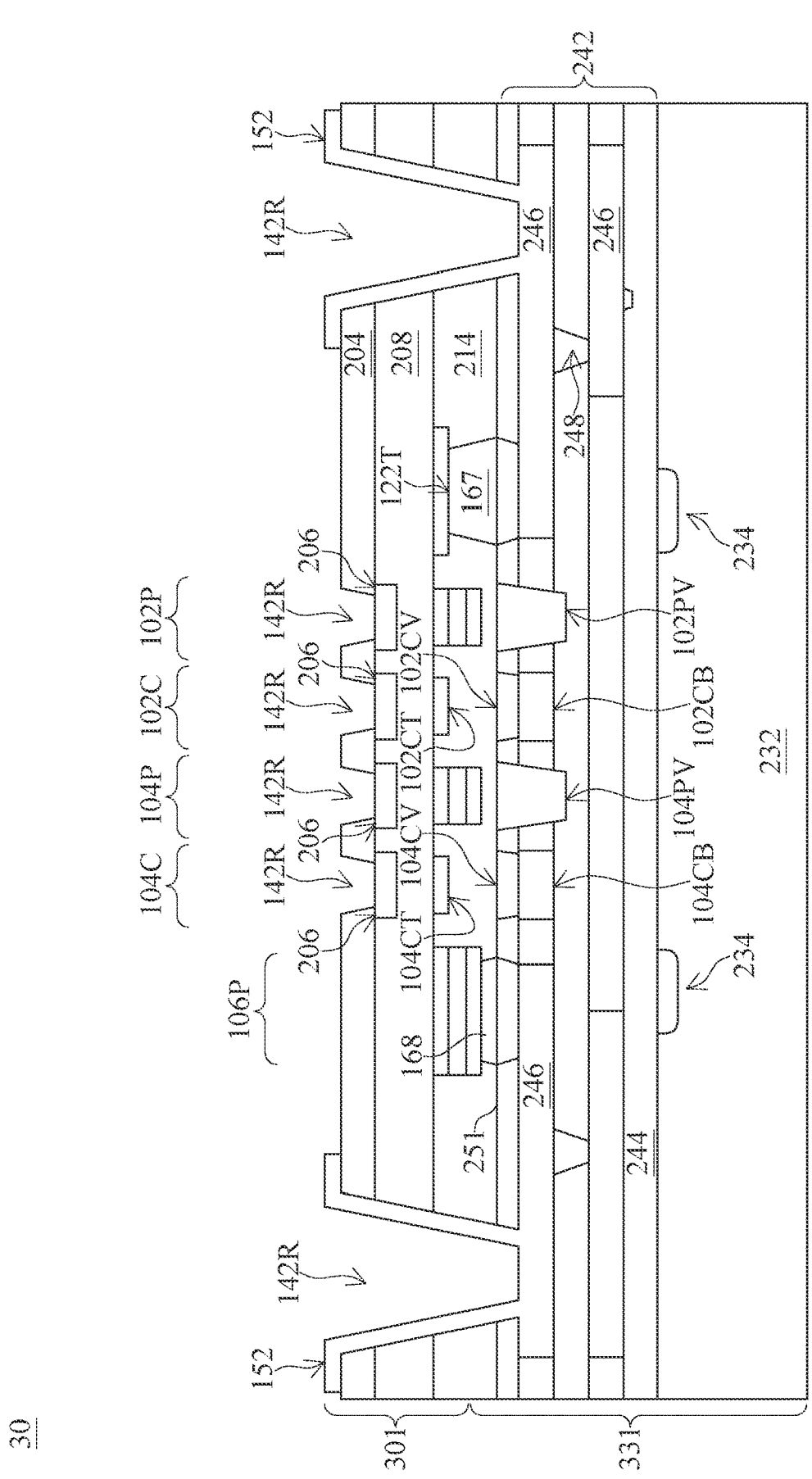

Subsequently, conductive lines 152 are formed through the recesses 142R to electrically couple the RDL 242 of the device substrate 331 to external circuits. Referring to FIGS. 2J and 3I, the conduction paths represented by the conductive lines 122T and 122B in FIGS. 1A and 1B for the pMUT and cMUT units are implemented in the MUT device 30 through the conductive lines 152, the RDL 242 and the conductive vias 167 and 168.

Referring to FIG. 2J and FIG. 3I, the interconnect wiring structures for the pMUT devices 102P and 104P and the cMUT devices 102C and 104C in the MUT device 30 are established by the wiring operations illustrated in FIG. 3B prior to the bonding operation illustrated in FIG. 3G. As a result, only the formation of the conductive lines 152 is required in the bonded MUT device 30 as shown in FIG. 3I. This process change provides the advantage that the wiring structure in FIG. 3B can be designed to be more compact. The chip area and manufacturing cost of the MUT device 30 can be further reduced accordingly.

The operations of bonding the MEMS substrate 301 to the device substrate 331 and subsequent operations shown in FIGS. 3G to 3I may be performed at the first temperature lower than the second temperature at which the MEMS substrate 301 is fabricated. (The second temperature may be, e.g., between about 700° C. and about 800° C.). In some embodiments, the operations illustrated in FIGS. 3G to 3I are performed at a temperature up to about 200° C.

FIGS. 4A to 4L are cross-sectional views of intermediate stages of a method of manufacturing a MUT device 40, in accordance with some embodiments. The method of manufacturing the MUT device 40 shares some operations with those of manufacturing the MUT device 20 or 30. Therefore, details of the operations and features that have been described in preceding paragraphs are not repeated for simplicity.

Figure 4A:
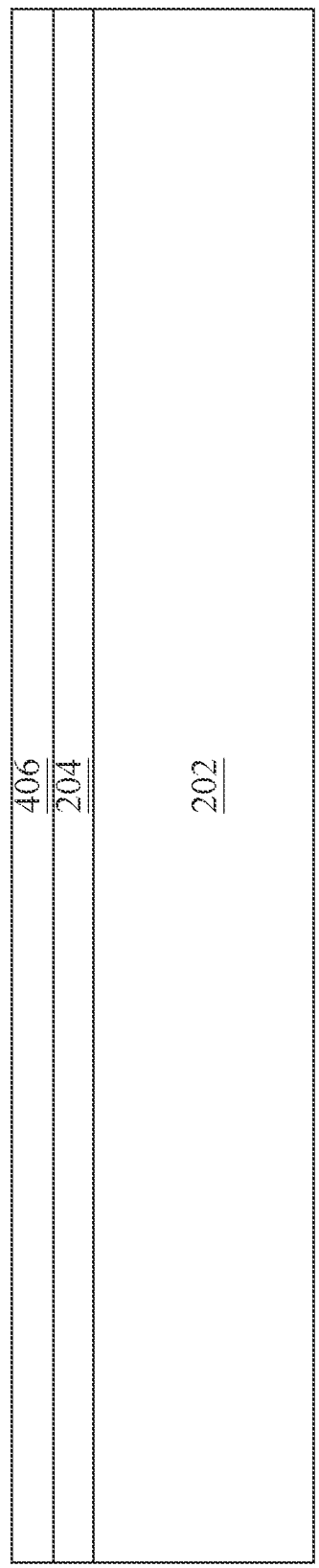

Referring to FIG. 4A, the MEMS substrate 401 is provided or formed similar to the MEMS substrate 201 or 301. The dielectric layer 204 is deposited over the substrate 202. A first conductive layer 406 is formed over the dielectric layer 204. The first conductive layer 406 may include a material same as that of the protection regions 206, such as polysilicon. In some embodiments, the first conductive layer 406 is a polysilicon region. The first conductive layer 406 may be doped with impurities, such as N-type dopants or P-type dopants. In some embodiments, the first conductive layer 406 is not patterned in the present stage and is used as electrodes of the cMUT units of the MUT device 40, as is described in subsequent paragraphs. In some embodiments, the first conductive layer 406 is formed of a metallic material, such as gold, silver, copper, iron, aluminum, tungsten, titanium, or the like.

Figure 4B:
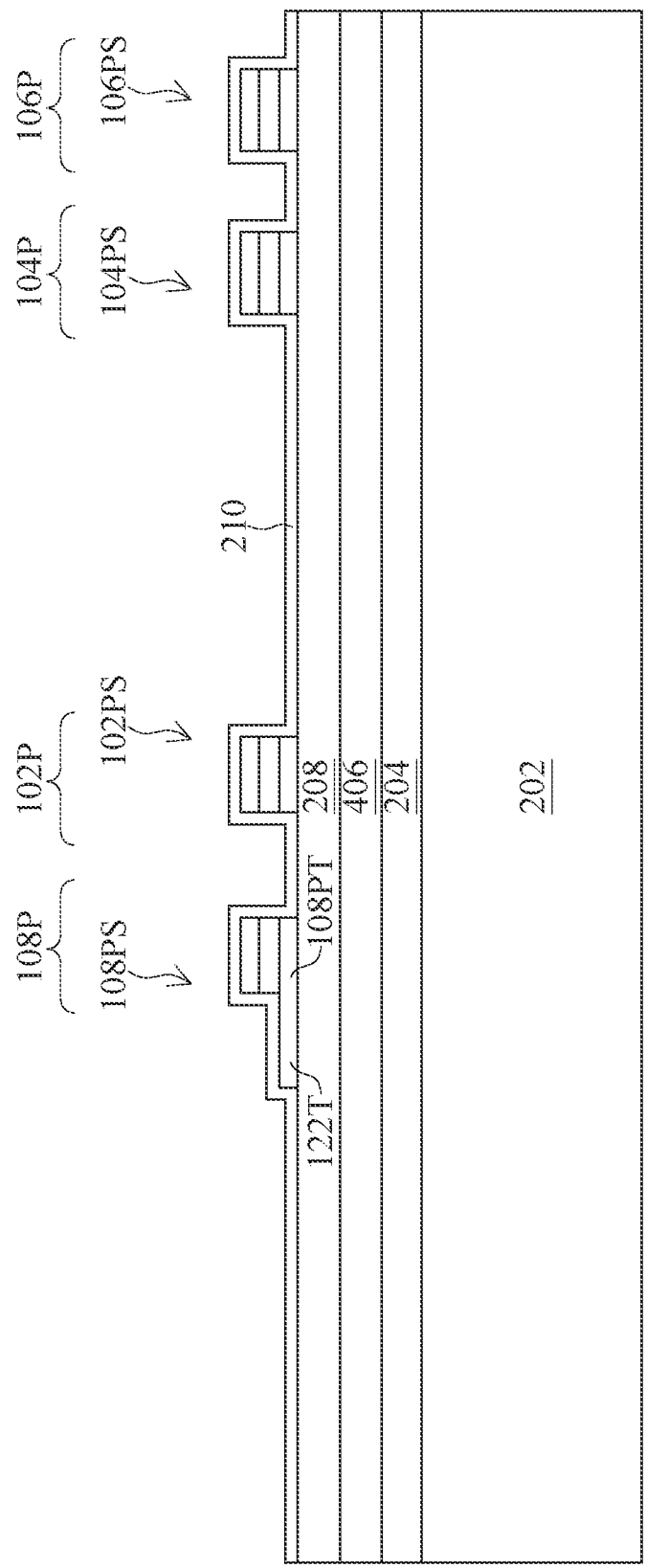

Referring to FIG. 4B, the dielectric layer 208 is formed to cover the first conductive layer 406. Membrane stacks 102PS, 104PS, 106PS and 108PS of respective pMUT units 102P, 104P, 106P and 108P are formed over the dielectric layer 208. Simultaneously, the conductive line 122T is formed and patterned over the dielectric layer 208 and electrically coupled to the top electrode 108PT. A dielectric layer 210 is deposited over the dielectric layer 208, the membrane stacks 102PS, 104PS, 106PS and 108PS, and the conductive line 122T. The dielectric layer 210 may be conformally formed over the top surfaces and sidewalls of the dielectric layer 208, the membrane stacks 102PS, 104PS, 106PS and 108PS, and the conductive line 122T.

Figure 4C:
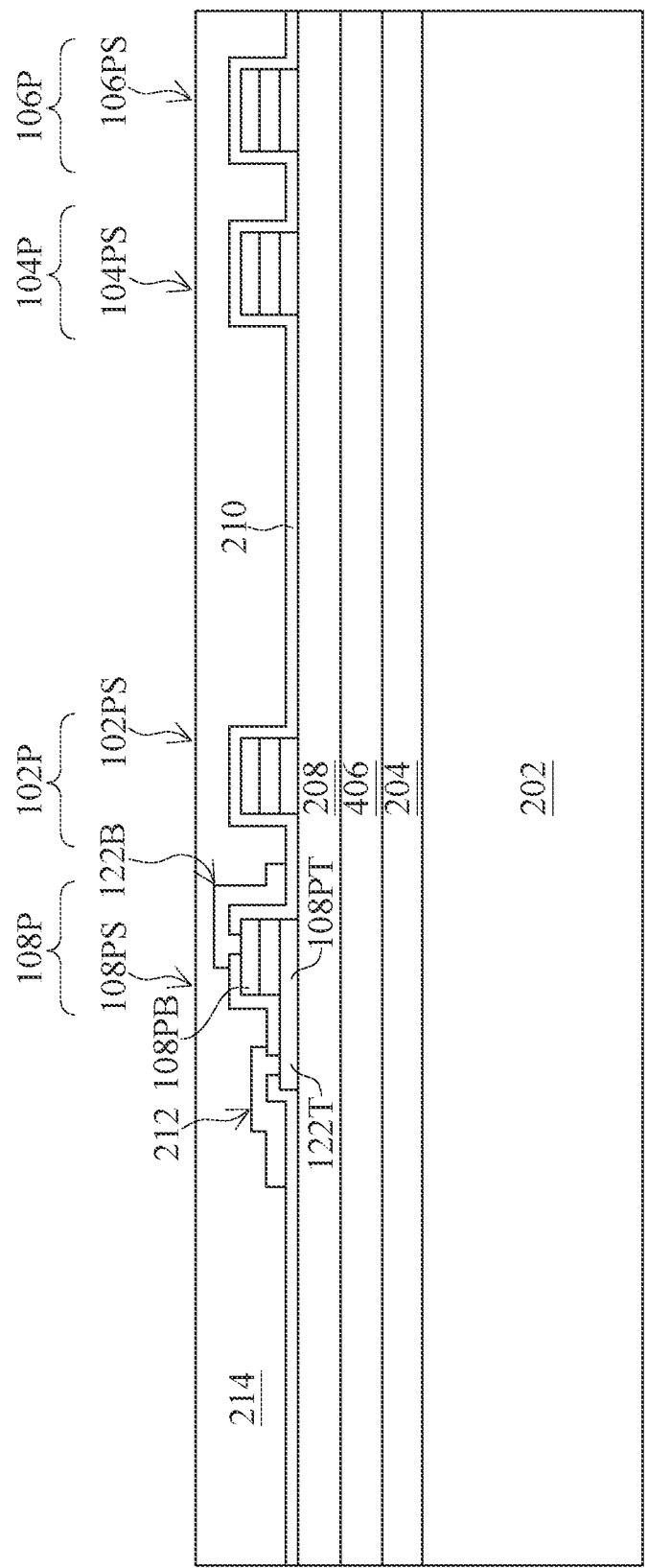

Referring to FIG. 4C, conductive lines 122B and 212 are formed and patterned over the dielectric layer 210. The conductive line 122B is electrically coupled to the upper surface of the bottom electrode 108PB, and the conductive line 212 is electrically coupled to the upper surface of the conductive line 122T. Subsequently, the dielectric layer 214 is formed to cover and laterally surround the dielectric layer 210, the membrane stacks 102PS, 104PS, 106PS and 108PS, and the conductive lines 122T, 122B and 212.

Figure 4D:
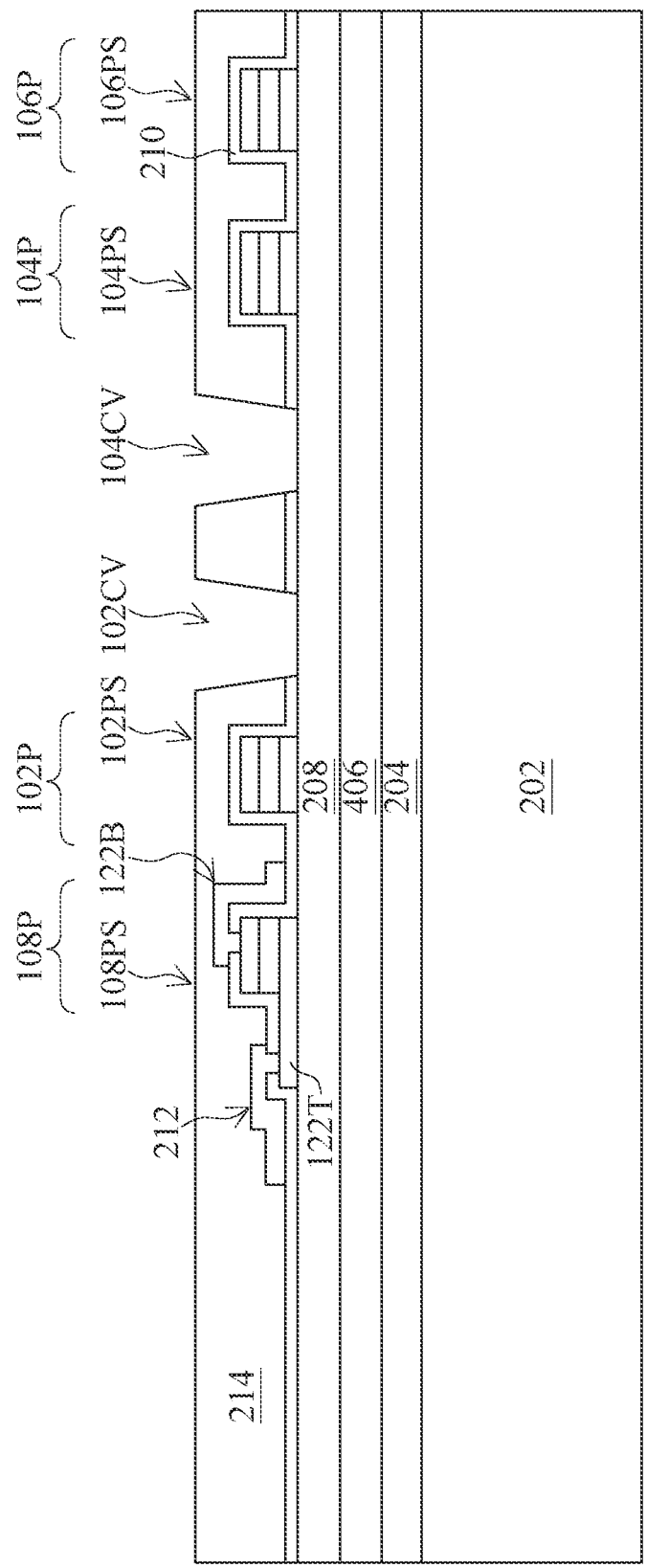

Cavities 102CV and 104CV of the respective cMUT units 102C and 104V are formed on the surface of the dielectric layer 214, as illustrated in FIG. 4D. The cavities 102CV and 104CV are etched through the dielectric layers 214 and 210. The upper surface of the dielectric layer 208 is thus exposed to the cavities 102CV and 104CV. In some embodiments, the cavities 102CV and 104CV are adjacent to each other without being intervened by any features of the pMUT units 102P, 104P, 106P and 108P. In some embodiments, the cavities 102CV and 104CV have sidewalls tapering from the upper surface of the dielectric layer 214 to the upper surface of the dielectric layer 208.

Figure 4E:
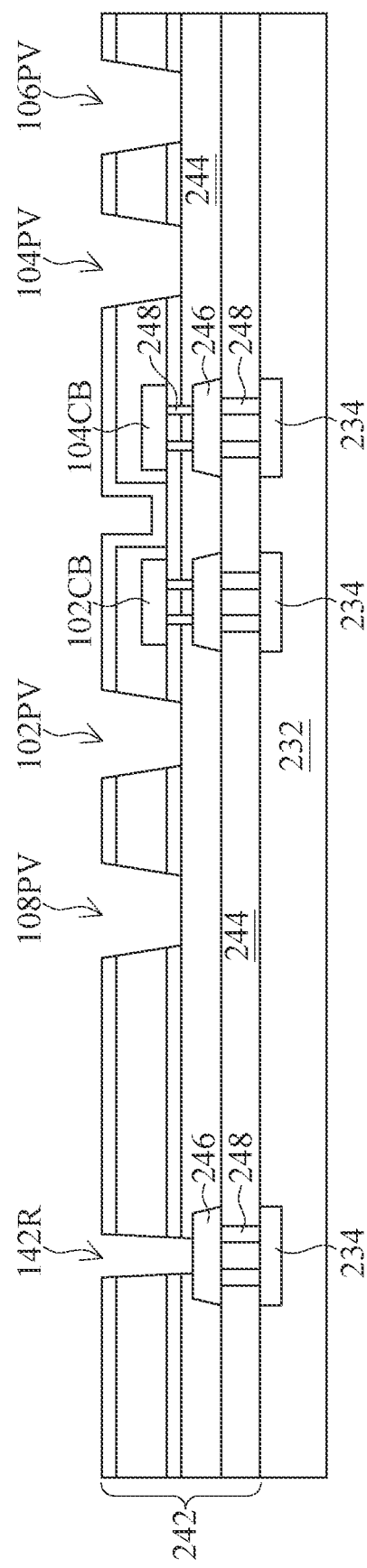

FIG. 4E illustrates the fabrication of the device substrate 431. The device substrate 431 is similar to the device substrate 231 or 331, except that the interconnect wiring topology of the RDL 242 formed by the conductive lines 246 and conductive vias 248 of the device 431 may be different from those of the RDL 242 in the device substrate 231 or 331, depending on the design requirement. Further, the RDL 242 of the device substrate 431 includes the bottom electrodes 102CB and 104CB formed in a metallization layer. The RDL 242 may include one or more passivation layers to cover the bottom electrodes 102CB and 104CB.

Several cavities are formed on the surface of the RDL 242. For example, cavities 102PV, 104PV, 106PV and 108PV for the pMUT units 102P, 104P, 106P and 108P are formed on two sides of the bottom electrodes 102PB and 104CB. In some embodiments, the cavity 102PV, 104PV, 106PV or 108PV has a bottom surface lower than a bottom surface of the bottom electrode 102CB or 104CB. In some embodiments, the cavity 102PV, 104PV, 106PV or 108PV has sidewalls tapering from the upper surface of the RDL 242 to the bottom of the respective cavity 102PV, 104PV, 106PV or 108PV.

Figure 4F:
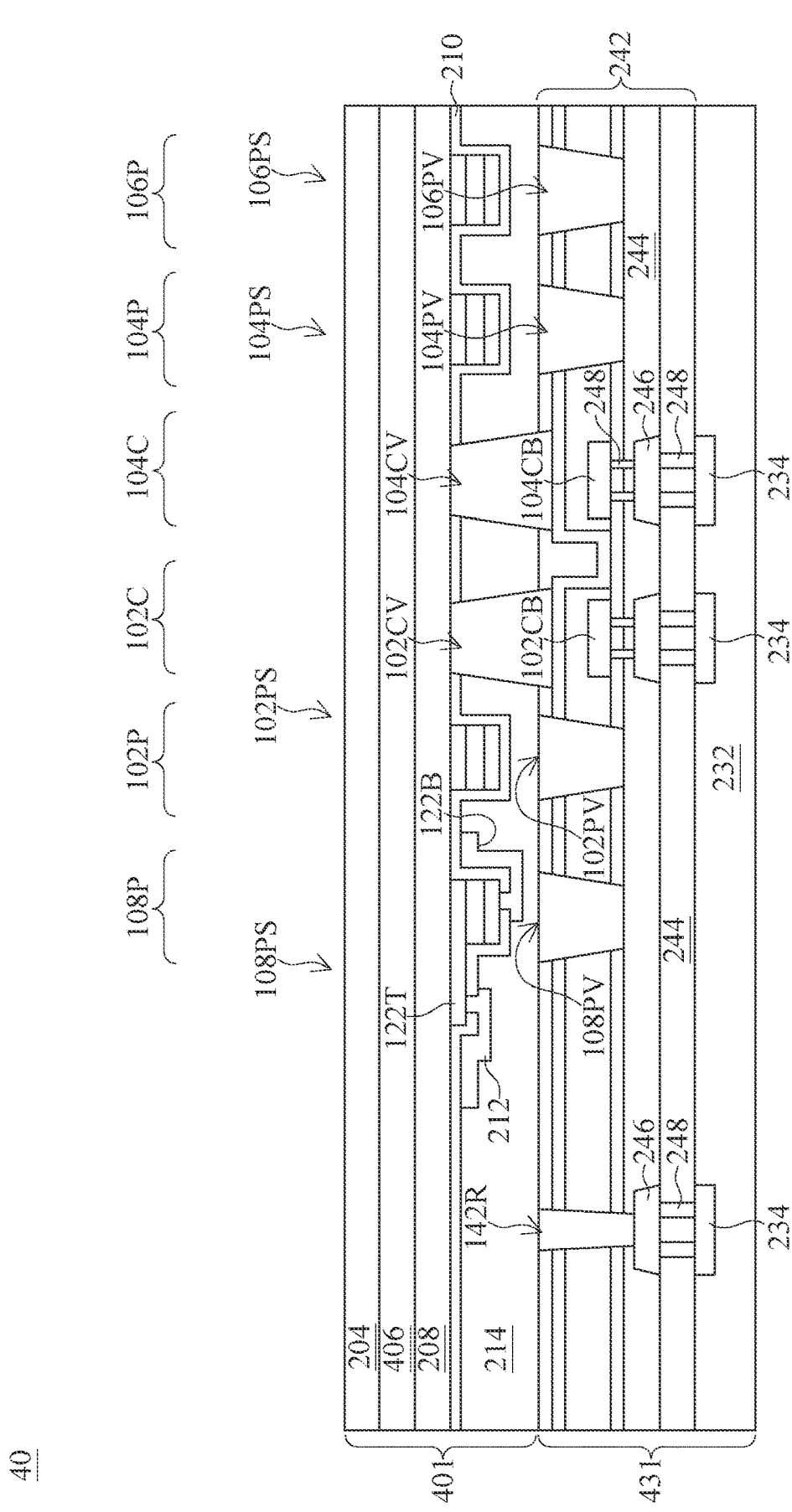

Referring to FIG. 4F, the MEMS substrate 401 is flipped and bonded to the device substrate 431 to form the MUT device 40. The substrate 202 of the MEMS substrate 401 is subsequently thinned or removed after the bonding operation. In some embodiments, the substrate 232 of the device substrate 431 is thinned. Through the bonding operation, the dielectric layer 214 of the MEMS substrate 401 is bonded to the device substrate 431. In some embodiments, due to the flipped MEMS substrate 401, the cavity 102CV or 104CV has sidewalls tapering toward the upper surface of the MUT device 40, which is opposite to the sidewall of the cavity 102PV, 104PV, 106PV or 108PV that tapers toward the lower surface of the MUT device 40.

In the bonded structure of the MUT device 40, the cMUT units 102C and 104C are disposed immediately adjacent to each other between the pMUT units 102P and 104P. The cavities 102CV and 104CV are aligned with the bottom electrodes 102CB and 104CB of the cMUT units 102C and 104C, respectively. The membrane stacks 102PS, 104PS, 106PS and 108PS of the pMUT units 102P, 104P, 106P and 108P are aligned with the cavities 102PV, 104PV, 106PV and 108PV, respectively. The cavities 102PV, 104PV, 106PV, 108PV, 102CV and 104CV are formed to provide spaces for the deflection of the movable membrane stacks 102PS, 104PS, 106PS and 108PS of the pMUT units 102P, 104P, 106P and 108P or the membrane structure made of the movable top electrodes of the cMUT units 102C and 104C during sensing and generation of ultrasound.

Figure 4G:
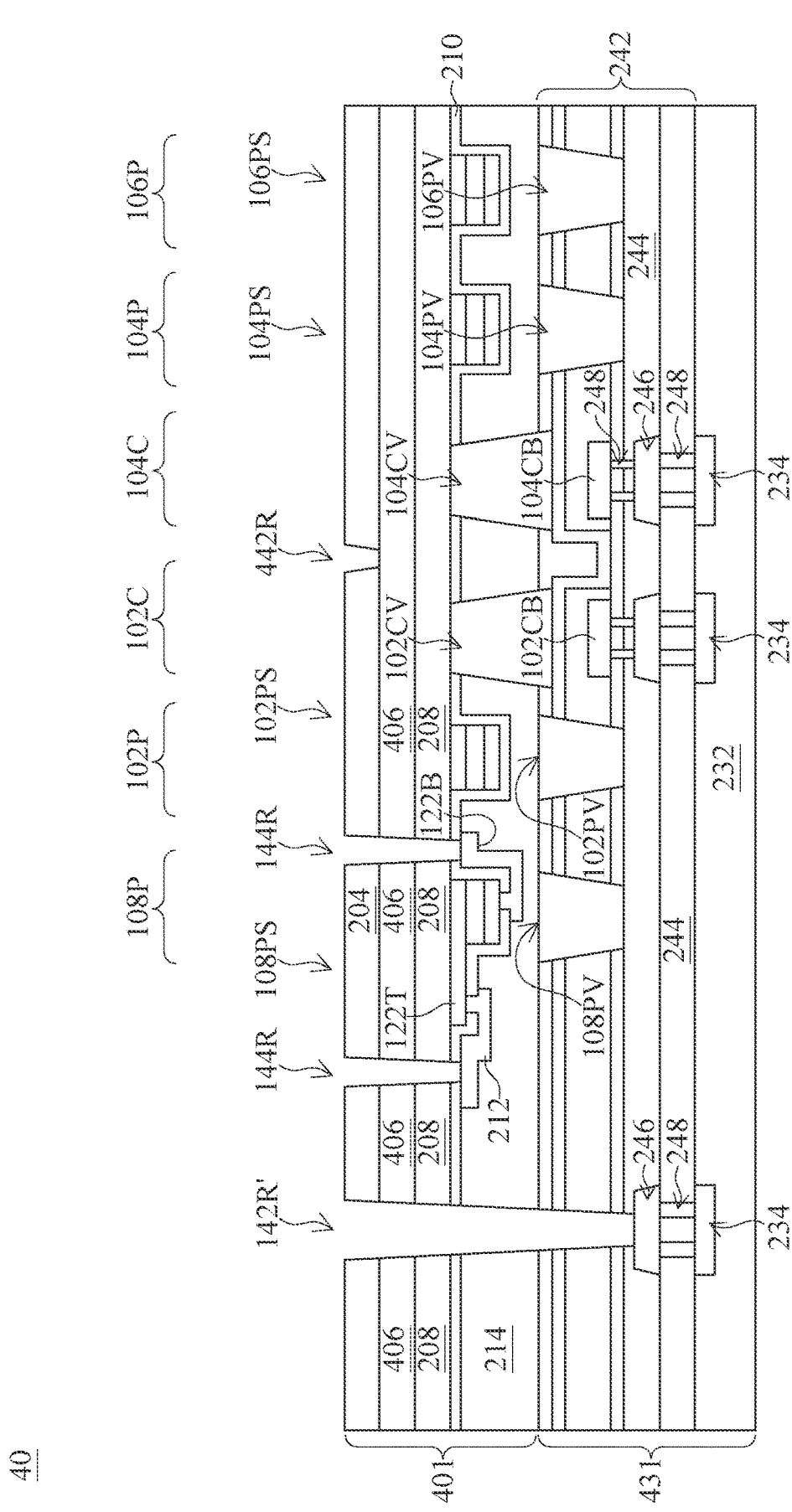

Subsequently, recesses 142R', 144R and 442R are formed on the upper surface of the MUT device 40, as shown in FIG. 4G. For example, the recesses 142R' is formed through the MEMS substrate 401 and at least one metallization layer of the RDL 242 so as to communicate with the recess 142R and expose the upper surface of the corresponding conductive line 246. Further, two recesses 144R are formed through the dielectric layer 204, the conductive layer 406 and the dielectric layers 208 and 210 and expose upper surfaces of the corresponding conductive lines 122B and 212. The recess 442R is formed through the dielectric layer 204 and exposes the upper surface of the conductive layer 406. The recesses 142R' and 144R may be formed using an etching operation, such as a dry etching, a wet etching, an RIE, a plasma etching, or the like, with the conductive lines 246, 122B and 212 acting as etch stop layers. The recess 442R may be formed using an etching operation, similar to that of the recesses 142R' and 144R, with the conductive layer 406 acting as an etch stop layer. In some embodiments, the recesses 142R', 144R and 442R have a circular shape or polygonal shape from a top-view perspective.

The conductive layer 406 acts as a shared top electrode for the cMUT devices 102C and 104C. The shared top electrode 406 as formed may allow the cMUT units 102C and 104C to function as a unit. The cost and area consumption of the interconnected wiring structures may be reduced. Further, the shared top electrode 406 has an electrode area greater than the area sum of the individual separate top electrodes of the cMUT devices 102C and 104C, and therefore the resultant capacitive performance is improved. In some embodiments, the shared top electrode 406 extends over the bottom electrodes 102CB and 104CB, and the pMUT units 108P, 102P, 104P and 106P.

Figure 4H:
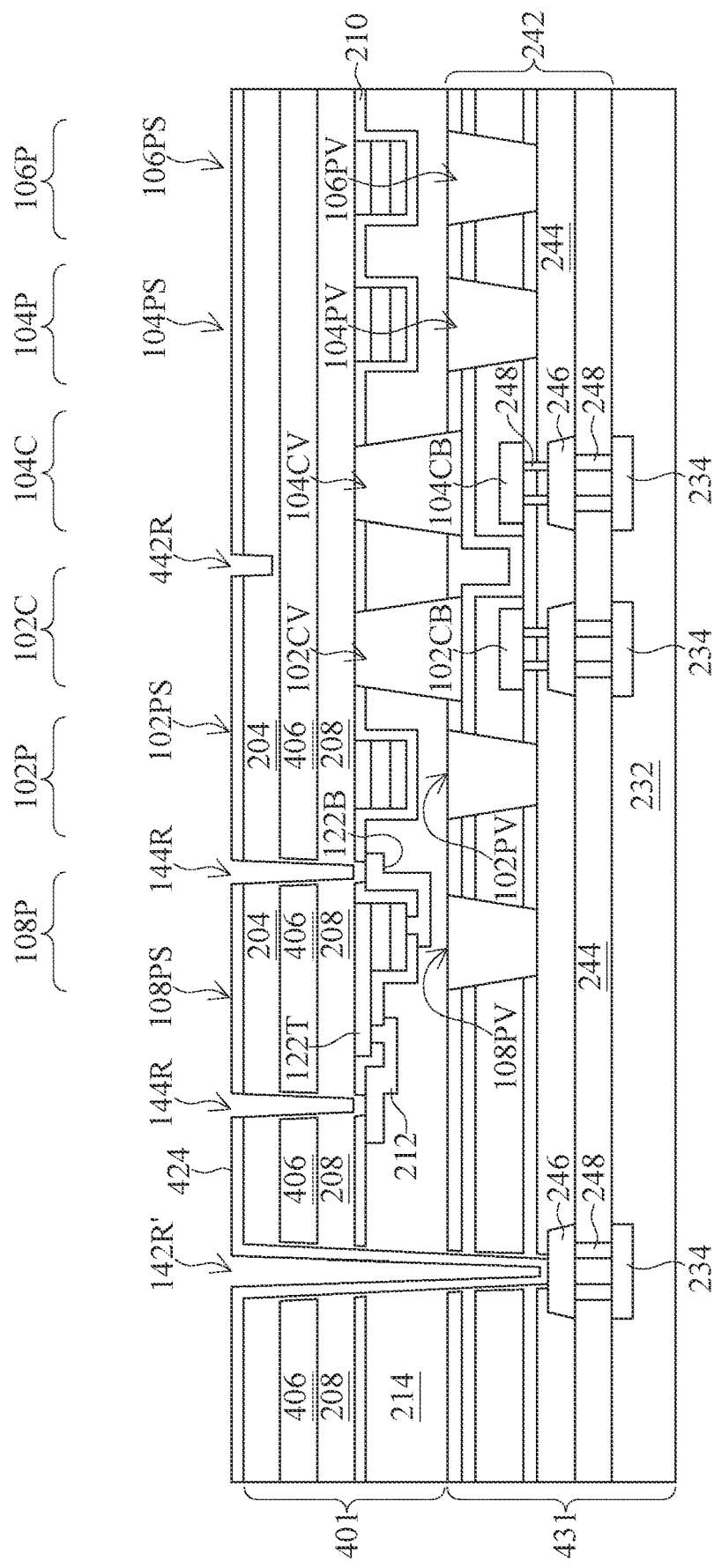
Figure 41:
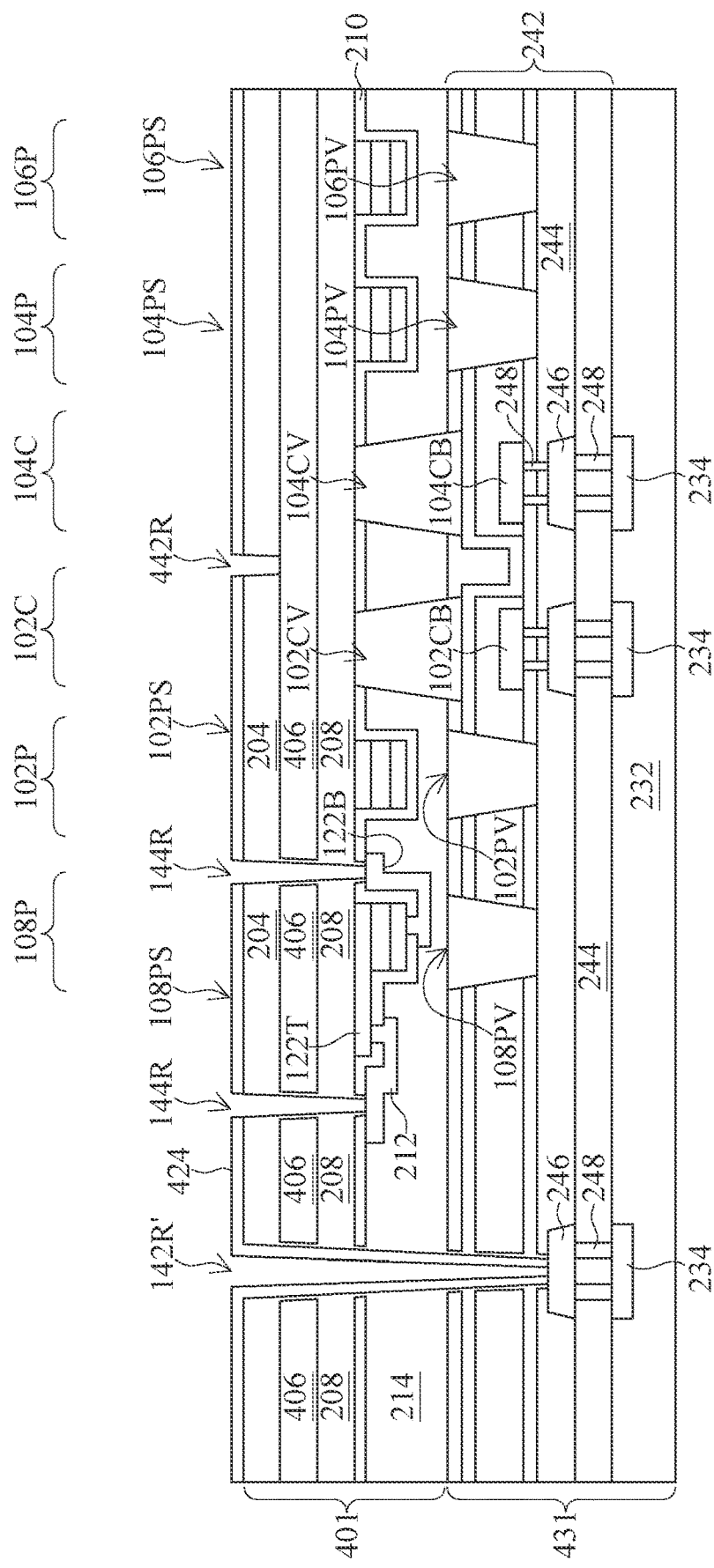

FIG. 4H shows the deposition of a dielectric layer 424 over the surface of the MUT device 40 and in the recesses 142R', 144R and 442R. The dielectric layer 424 is deposited along the sidewalls and bottoms of the recesses 142R', 144R and 442R in a conformal manner. The dielectric layer 424 may include silicon oxide; however, other materials, such as silicon nitride, silicon carbide and silicon oxynitride, may also be used. The dielectric layer 424 may have a thickness between about 1 nm and about 100 nm. The dielectric layer 424 may be formed by thermal oxidation, PVD, CVD, ALD, a combination thereof, or the like. The sidewalls of the shared top electrode 406 that were exposed to the recesses 142R', 144R and 442R are covered by the dielectric layer 424 for electrical insulation.

Referring to FIG. 4I, an etching operation is performed on the bottoms of the recesses 142R', 144R and 442R to re-expose the upper surfaces of the conductive lines 246, 212 and 122B and the shared top electrode 406. Portions of the dielectric layer 424 at the bottoms of the recesses 142R', 144R and 442R are removed through the etching operation. The etching operation may be a dry etch, a wet etch, an RIE, a plasma etch, combinations thereof, or the like. In some embodiments, the etching operation is an anisotropic etch that simultaneously removes a thickness of the upper surface of the RDL 242.

Figure 4J:
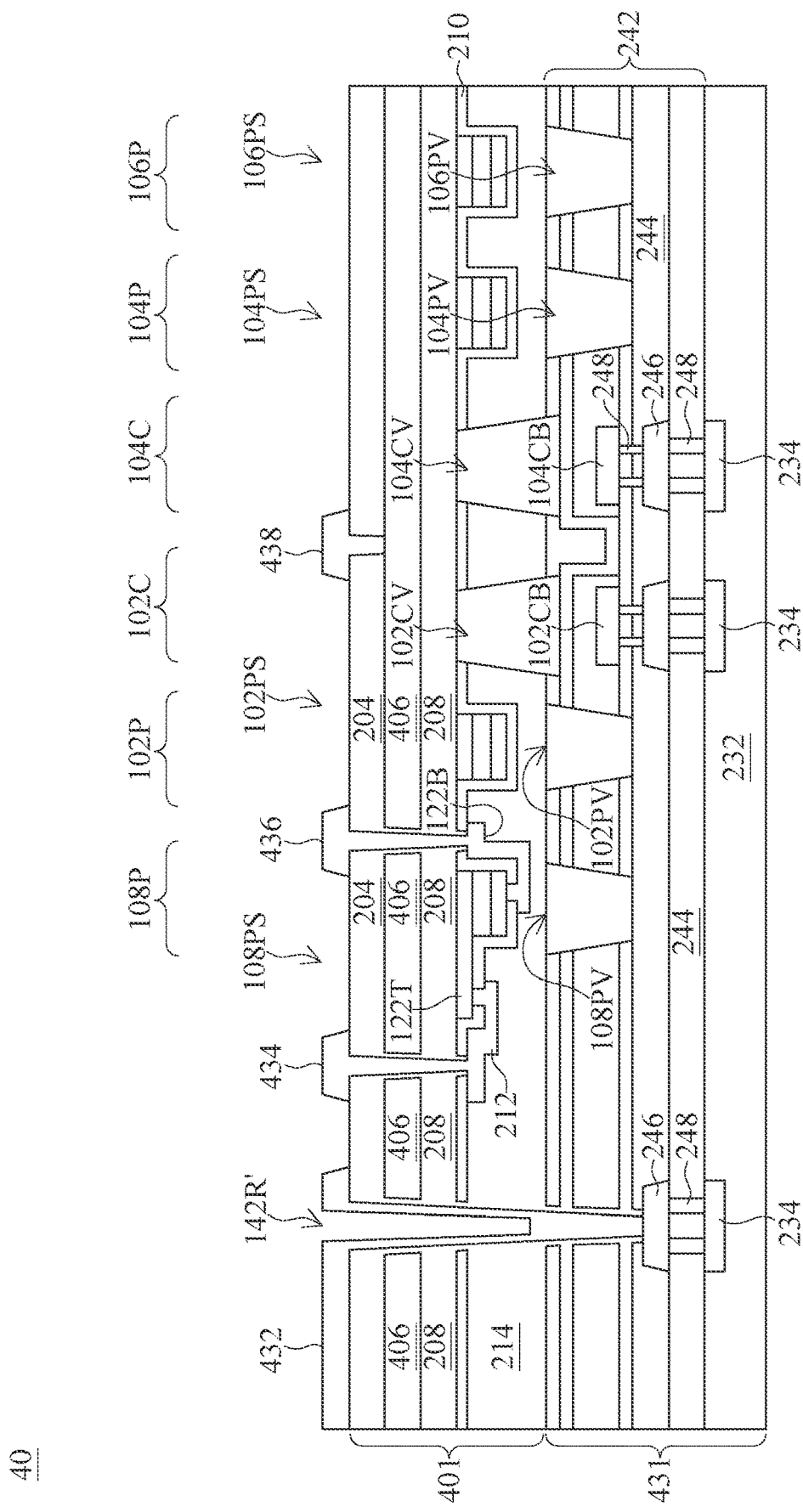

Subsequently, conductive lines 432, 434, 436 and 438 are formed in the recesses 142R', 144R and 442R, as illustrated in FIG. 4J. The conductive line 432 is electrically coupled to the conductive line 246 of the RDL 242. The conductive lines 434 and 436 are electrically coupled to the conductive lines 212 and 122B, respectively. The conductive line 438 is electrically coupled to the shared top electrode 406. The materials and methods of formation of the conductive lines 432, 434, 436 and 438 are similar to those of the conductive lines 152 described with reference to FIGS. 2J and 3I.

Figure 4K:
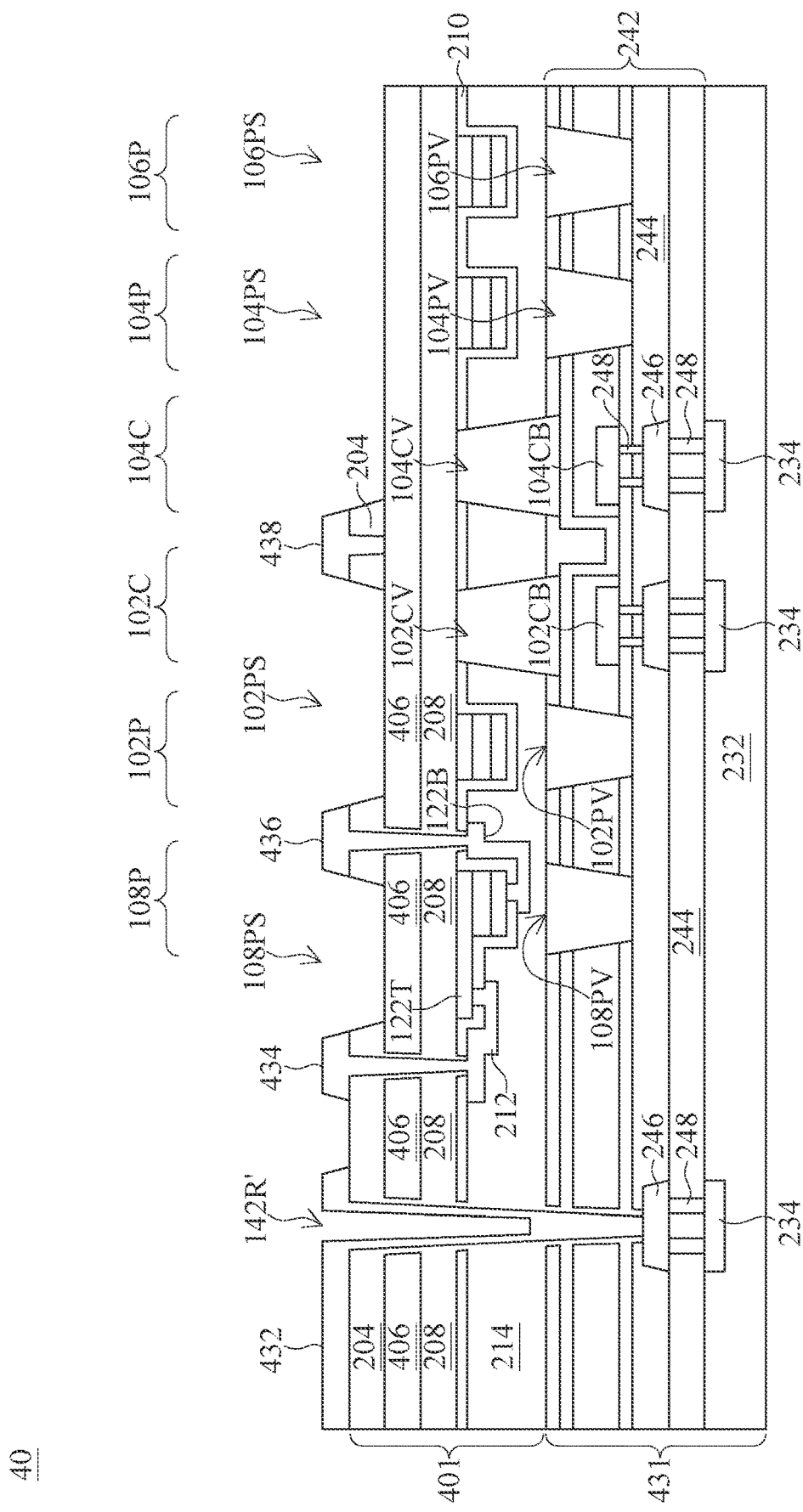

Referring to FIG. 4K, portions of the dielectric layer 204 are further thinned or removed. Portions of the dielectric layer 204 aligned with the pMUT units 102P, 104P, 106P and 108P and the cMUT units 102C and 104C are removed through a patterning operation. The patterning operation may be performed by photolithography and etching operations. Portions of the upper surfaces of the shared top electrode 406 are thus exposed. As a result, the membrane stacks of the pMUT units 102P, 104P, 106P and 108P thus obtain reduced thicknesses as desired.

Figure 4L:
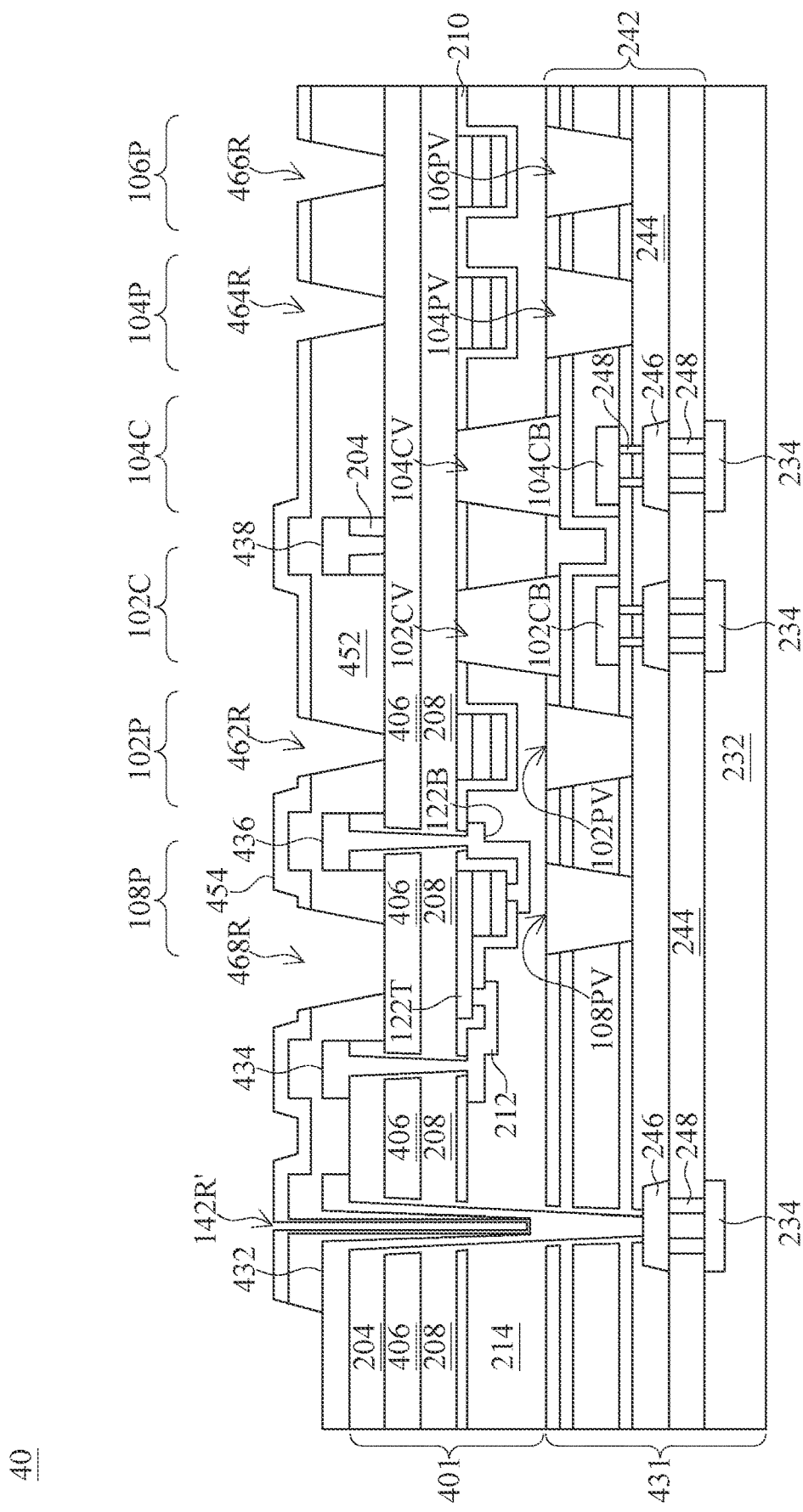

FIG. 4L illustrates the formation of dielectric layers 452 and 454. The dielectric layers 452 and 454 may be formed of silicon oxide, silicon nitride, silicon oxynitride, a high-k dielectric material or other suitable dielectric materials. In some embodiments, the dielectric layers 452 and 454 are formed of different materials. In some embodiments, the dielectric layers 452 and 454 are deposited by CVD, PVD, ALD, or other suitable deposition processes. A patterning operation is performed to remove portions of the dielectric layers 452 and 454 over the pMUT units 102P, 104P, 106P and 108P. Recesses 462R, 464R, 466R and 468R are formed and the upper surface of the shared top electrode 406 is exposed partially through the patterning operation. In addition, portions of the dielectric layers 452 and 454 over and aligned with the cMUT units 102C and 104C are retained for protecting the sections of the shared top electrode 406 of the cMUT units 102C and 104C from being damaged.

The operations of bonding of the MEMS substrate 401 to the device substrate 431 illustrated in FIG. 4F and subsequent operations illustrated in FIGS. 4G to 4L may be performed at the first temperature lower than the second temperature at which the MEMS substrate 401 is fabricated (the second temperature may be, for example, between about 700° C. and about 800° C.). In some embodiments, the operations illustrated in FIGS. 4F to 4L are performed at a temperature up to about 200° C.

The proposed hybrid MUT devices provide advantages. The proposed MUT device provides an array of pMUT and cMUT units for supporting a hybrid mode of sensing and generation of ultrasound. A wider bandwidth is achieved for the generation and sensing of ultrasound. In addition, the array of pMUT and cMUT units allows for pixel-wise manipulation of MUT units, thereby increasing the transmission and sensing resolution. In addition, the manufacturing cost of the MUT device is reduced.

According to an embodiment, a method of manufacturing a semiconductor device includes: forming a first substrate includes a membrane stack over a first dielectric layer, the membrane stack having a first electrode, a second electrode over the first electrode and a piezoelectric layer between the first electrode and the second electrode, a third electrode over the first dielectric layer, and a second dielectric layer over the membrane stack and the third electrode; forming a second substrate, including: a redistribution layer (RDL) over a third substrate, the RDL having a fourth electrode; and a first cavity on a surface of the RDL adjacent to the fourth electrode; forming a second cavity in one of the first substrate and the second substrate; and bonding the first substrate to the second substrate.

According to an embodiment, a method of manufacturing an ultrasonic transducer device includes: forming a first substrate, including: depositing a first dielectric layer over a carrier substrate; forming a membrane stack of a piezoelectric ultrasonic transducer and a polysilicon region over the first dielectric layer; and depositing a conductive line to electrically couple to the membrane stack. The method further includes: forming a second substrate and bonding the first substrate to the second substrate. The forming of the second substrate includes: forming a redistribution layer (RDL) over a third substrate, the RDL having a bottom electrode of a capacitive ultrasonic transducer and an intermetal dielectric layer over the bottom electrode; and etching a first cavity on a surface of the RDL adjacent to the bottom electrode.

According to an embodiment, an ultrasonic transducer device includes a redistribution layer (RDL) over a first substrate and a dielectric layer over the RDL, and a piezoelectric transducer including a membrane stack in the dielectric layer, the membrane stack includes a top electrode, a piezoelectric layer and a bottom electrode over one another. The ultrasonic transducer device also includes a capacitive transducer adjacent to the piezoelectric transducer and including: a top electrode in the dielectric layer, and a bottom electrode in the RDL and aligned with the top electrode. The ultrasonic transducer device further includes a first conductive line electrically coupled to the membrane stack of the piezoelectric transducer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
   forming a first substrate, comprising:
      a membrane stack over a first dielectric layer, the membrane stack comprising a first electrode, a second electrode over the first electrode and a piezoelectric layer between the first electrode and the second electrode;
      a third electrode over the first dielectric layer; and
      a second dielectric layer over the membrane stack and the third electrode;
   forming a second substrate, comprising:
      a redistribution layer (RDL) over a third substrate, the RDL comprising a fourth electrode; and
      a first cavity on a surface of the RDL adjacent to the fourth electrode;
   forming a second cavity in one of the first substrate and the second substrate; and
   bonding the first substrate to the second substrate.

2. The method of claim 1, further comprising performing a thermal operation on the first substrate at a first temperature prior to the bonding, wherein the bonding comprises bonding the first substrate to the second substrate at a second temperature lower than the first temperature.

3. The method of claim 1, further comprising forming a protection region over the first dielectric layer prior to depositing the membrane stack.

4. The method of claim 3, further comprising depositing a third dielectric layer over the protection region, wherein depositing the membrane stack comprises depositing the membrane stack over the third dielectric layer and aligned with the protection region.

5. The method of claim 3, further comprising etching a first recess through the first dielectric layer subsequent to the bonding, the first recess exposing the protection region.

6. The method of claim 1, wherein depositing a membrane stack over a first dielectric layer comprises depositing a conductive layer and patterning the conductive layer to form the first electrode of the membrane stack, wherein the method further comprises forming a conductive line electrically coupled to the first electrode during the patterning of the conductive layer of the membrane stack.

7. The method of claim 1, wherein forming a second cavity comprises etching the second cavity in the RDL of the second substrate, the second cavity being adjacent to the first cavity and exposing the fourth electrode.

8. The method of claim 1, wherein the first cavity comprises a depth greater than a depth of the second cavity.

9. The method of claim 1, further comprising etching a second recess subsequent to the bonding, the second recess exposing the third electrode.

10. The method of claim 9, further comprising forming a conductive line in the second recess and electrically coupled to the third electrode.

11. A method of manufacturing an ultrasonic transducer device, comprising:
    forming a first substrate, comprising:
       depositing a first dielectric layer over a carrier substrate;

forming a membrane stack of a piezoelectric ultrasonic transducer and a polysilicon region over the first dielectric layer; and depositing a conductive line to electrically couple to the membrane stack;

forming a second substrate, comprising:

forming a redistribution layer (RDL) over a third substrate, the RDL comprising a bottom electrode of a capacitive ultrasonic transducer and an inter-metal dielectric layer over the bottom electrode; and etching a first cavity on a surface of the RDL adjacent to the bottom electrode; and bonding the first substrate to the second substrate.

12. The method of claim 11, wherein forming a first substrate further comprises:

depositing a second dielectric layer that laterally surrounds the membrane stack of the piezoelectric ultrasonic transducer; and etching a first recess in the second dielectric layer adjacent to the membrane stack.

13. The method of claim 11, wherein forming the membrane stack comprises:

depositing a first conductive layer, a piezoelectric layer over the first conductive layer and a second conductive layer over the piezoelectric layer; and patterning the first conductive layer to form a first electrode of the membrane stack and the conductive line.

14. The method of claim 11, further comprising forming a second recess on an upper surface of the first dielectric layer by performing an etching operation on the first dielectric layer with the polysilicon region acting as an etch stop layer.

15. The method of claim 14, wherein the second recess exposes a sidewall of the polysilicon region.

16. The method of claim 14, further comprising depositing a third dielectric layer to cover a sidewall and a bottom of the second recess.

17. The method of claim 16, further comprising forming a fourth dielectric layer that is aligned with the capacitive ultrasonic transducer subsequent to the etching of the first dielectric layer.

18. An ultrasonic transducer device, comprising:

a redistribution layer (RDL) over a first substrate;

a dielectric layer over the RDL;

a piezoelectric transducer comprising a membrane stack in the dielectric layer, the membrane stack comprising a top electrode, a piezoelectric layer and a bottom electrode over one another;

a capacitive transducer adjacent to the piezoelectric transducer and comprising:

a top electrode in the dielectric layer; and a bottom electrode in the RDL and aligned with the top electrode; and a first conductive line electrically coupled to the membrane stack of the piezoelectric transducer.

19. The ultrasonic transducer device of claim 18, further comprising a second piezoelectric transducer including:

a membrane stack over the RDL, the membrane stack comprising a top electrode, a piezoelectric layer and a bottom electrode over one another; and a third cavity in the RDL and aligned with the membrane stack of the second piezoelectric transducer, wherein the capacitive transducer is between the piezoelectric transducer and the second piezoelectric transducer.

20. The ultrasonic transducer device of claim 18, wherein the top electrode of the capacitive transducer extends over the membrane stack of the piezoelectric transducer.

* * * * *